(12) United States Patent
Lee et al.

(10) Patent No.: US 11,935,937 B2
(45) Date of Patent: *Mar. 19, 2024

(54) NANOSHEET FIELD-EFFECT TRANSISTOR DEVICE AND METHOD OF FORMING

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 12 days.

This patent is subject to a terminal disclaimer.

(21) Appl. No.: 17/577,169

(22) Filed: Jan. 17, 2022

(65) Prior Publication Data

US 2022/0140101 A1 May 5, 2022

Related U.S. Application Data

(63) Continuation of application No. 16/904,751, filed on Jun. 18, 2020, now Pat. No. 11,227,931.

(Continued)

(51) Int. Cl.
*H01L 29/49* (2006.01)
*H01L 21/02* (2006.01)
(Continued)

(52) U.S. Cl.
CPC .... *H01L 29/4908* (2013.01); *H01L 21/02603* (2013.01); *H01L 21/28088* (2013.01); *H01L 29/0673* (2013.01); *H01L 29/42392* (2013.01); *H01L 29/4966* (2013.01); *H01L 29/66545* (2013.01); *H01L 29/66742* (2013.01); *H01L 29/78696* (2013.01)

(58) Field of Classification Search
CPC .......... H01L 29/4908; H01L 21/02603; H01L 21/28088; H01L 29/0673; H01L 29/42392; H01L 29/4966; H01L 29/66545; H01L 29/66742; H01L 29/78696; H01L 29/1079; H01L 21/823431; H01L 29/0653; H01L 29/66439; H01L 29/775; H01L 29/165; H01L 29/7848; H01L 27/0886; H01L 21/823437; H01L 21/823821; H01L 21/823828; H01L 27/0924; B82Y 10/00
USPC ....................................................... 257/347
See application file for complete search history.

(56) References Cited

U.S. PATENT DOCUMENTS 11,227,931 B2 * 1/2022 Lee .................. H01L 29/42392
2019/0081152 A1 * 3/2019 Suh ................... H01L 21/28167
(Continued)

*Primary Examiner* — Tong-Ho Kim
(74) *Attorney, Agent, or Firm* — Slater Matsil, LLP

(57) ABSTRACT

A semiconductor device includes a fin protruding above a substrate; source/drain regions over the fin; nanosheets between the source/drain regions; and a gate structure over the fin and between the source/drain regions. The gate structure includes: a gate dielectric material around each of the nanosheets; a first liner material around the gate dielectric material; a work function material around the first liner material; a second liner material around the work function material; and a gate electrode material around at least portions of the second liner material.

20 Claims, 21 Drawing Sheets

Related U.S. Application Data

(60) Provisional application No. 62/955,166, filed on Dec. 30, 2019.

(51) Int. Cl.
*H01L 21/28* (2006.01)
*H01L 29/06* (2006.01)
*H01L 29/423* (2006.01)
*H01L 29/66* (2006.01)
*H01L 29/786* (2006.01)

(56) References Cited

U.S. PATENT DOCUMENTS

| | | | |
|---|---|---|---|
| 2020/0294865 A1* | 9/2020 | Cheng | ................ H01L 27/0924 |
| 2021/0013111 A1* | 1/2021 | Smith | ................ H01L 27/0922 |
| 2021/0098589 A1 | 4/2021 | Cheng et al. | |

* cited by examiner

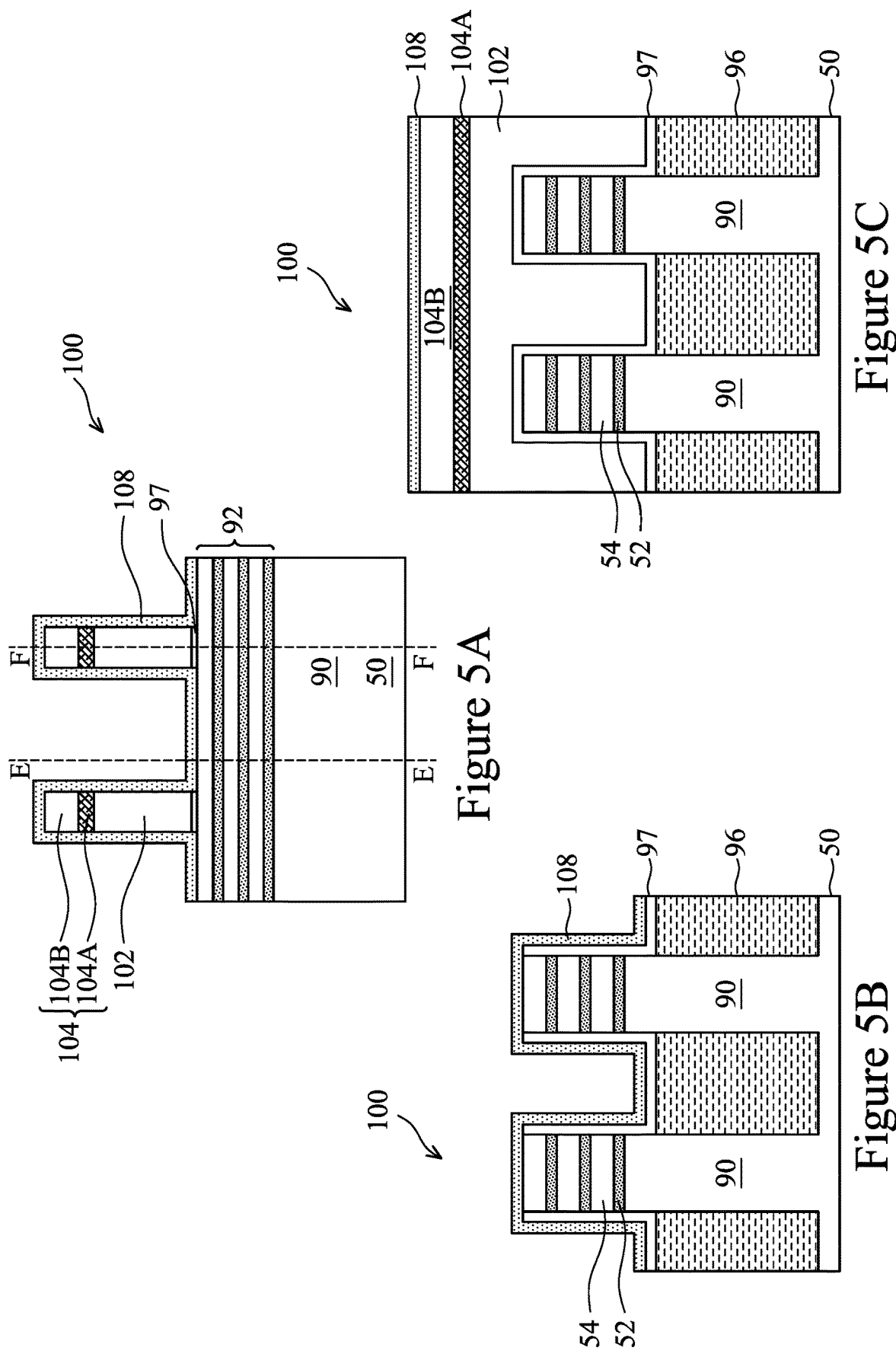

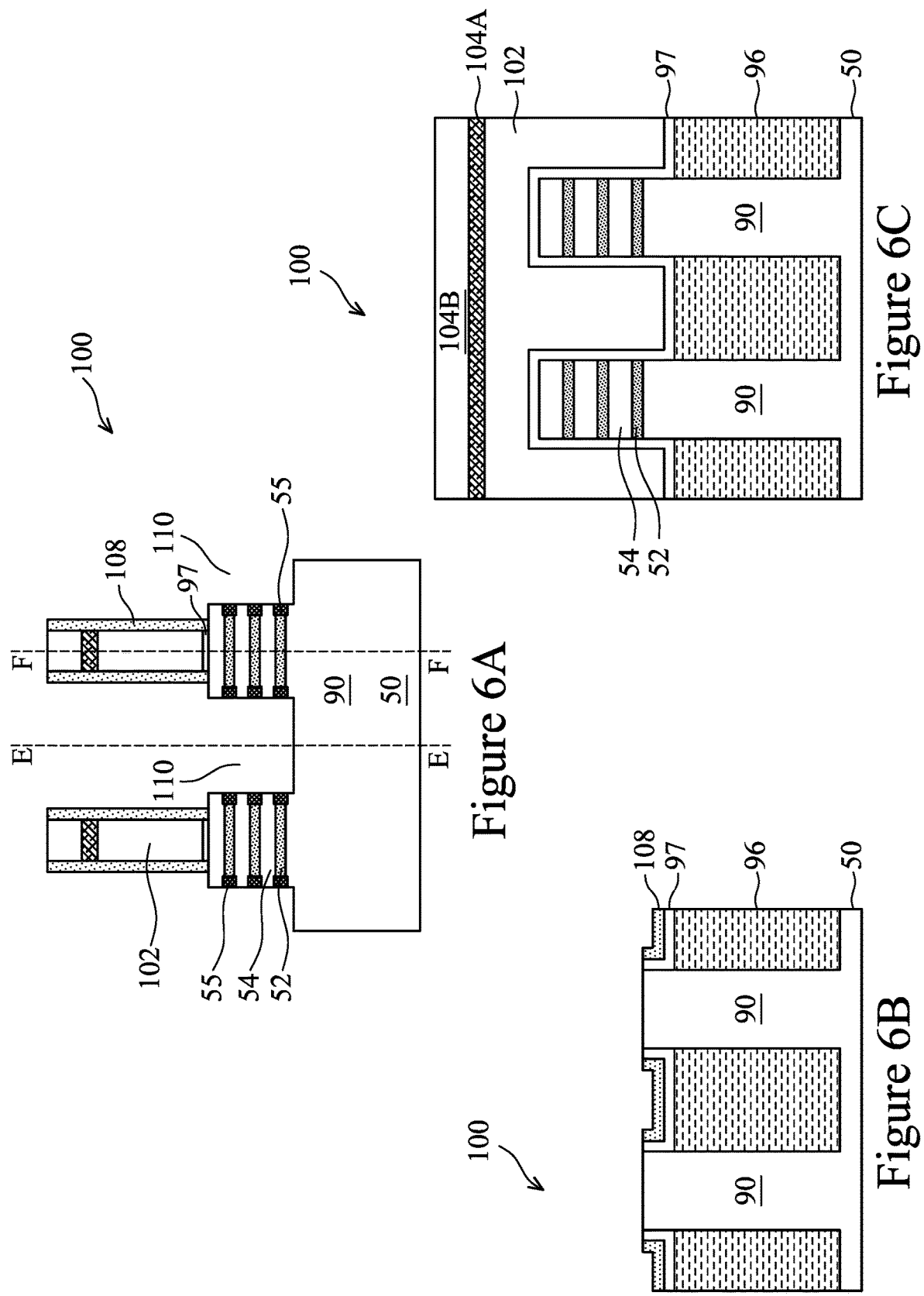

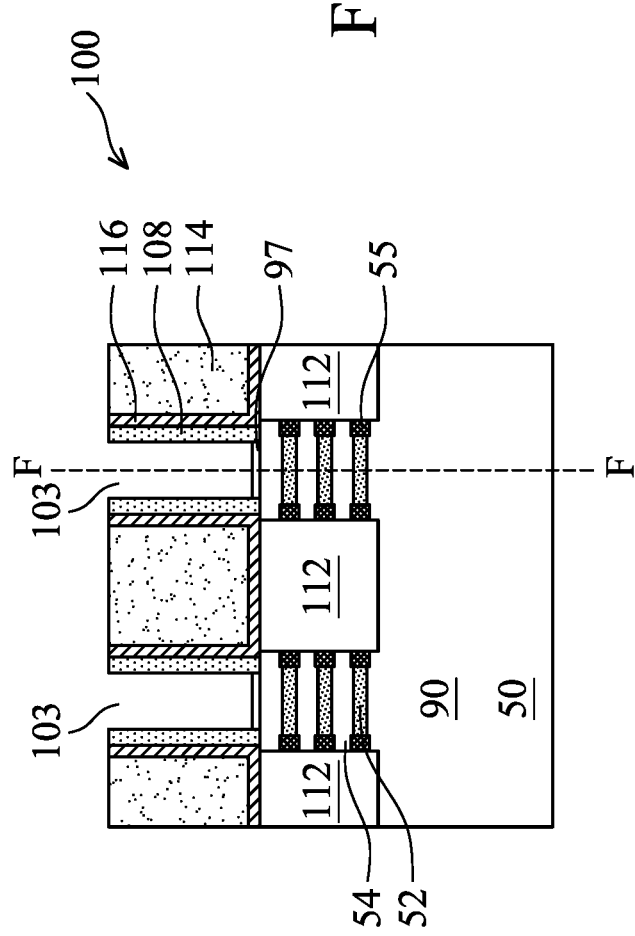
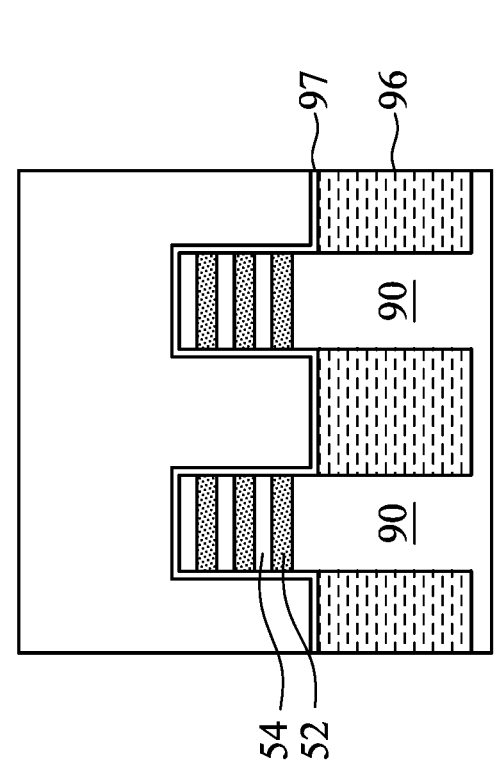
Figure 8A
Figure 8B

NANOSHEET FIELD-EFFECT TRANSISTOR DEVICE AND METHOD OF FORMING

PRIORITY CLAIM AND CROSS-REFERENCE

This application is a continuation of U.S. patent application Ser. No. 16/904,751, filed on Jun. 18, 2020, entitled "Nanosheet Field-Effect Transistor Device and Method of Forming", which claims the benefit of U.S. Provisional Application No. 62/955,166, filed on Dec. 30, 2019 and entitled "Nanosheet Field-Effect Transistor Device," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A-5C, 6A-6C, 7A-7C, 8A, 8B, 9A, 9B, 10A, 10B, 11-14, 15A, and 15B are cross-sectional views of a nanosheet field-effect transistor device at various stages of manufacturing, in accordance with an embodiment.

DETAILED DESCRIPTION

Figure 1:
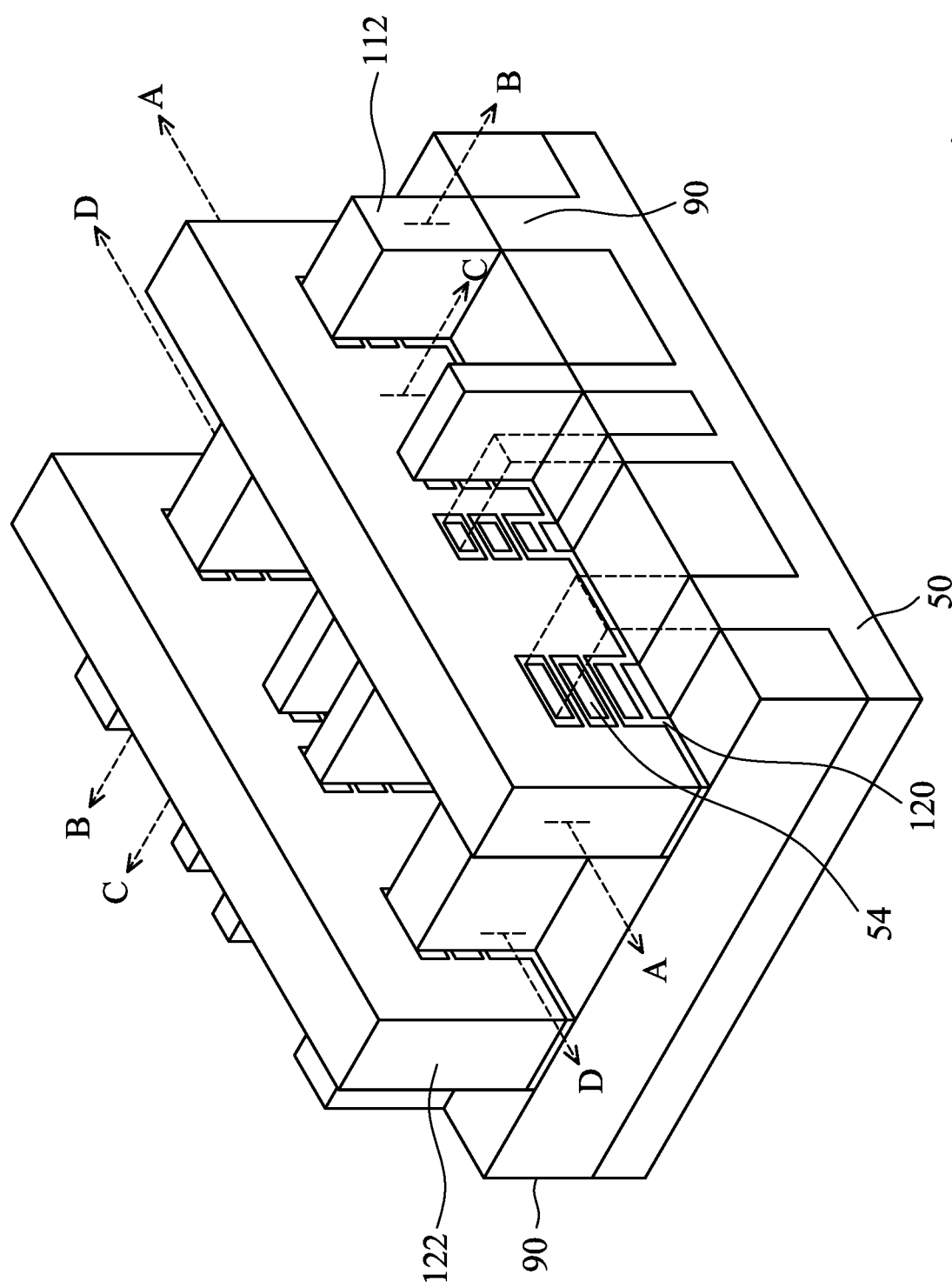
FIG. 1 illustrates an example of a nanosheet field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same reference number in different figures refers to the same or similar component formed by a same or similar formation method using a same or similar material(s).

In accordance with some embodiments, a multi-layer stack is formed over a substrate. The multi-layer stack comprising alternating layers of a first semiconductor material and a second semiconductor material. The substrate and the multi-layer stack are patterned to form a fin and a nanostructure overlying the fin, respectively. A dummy gate structure is next formed over the nanostructure and over the fin. Openings are formed on opposing sides of the dummy gate structure. Next, end portions of the first semiconductor material exposed by the openings are removed to form recesses, and inner spacers are formed in the recesses. Next, source/drain regions are formed in the openings. A replacement gate process is then performed to replace the dummy gate structure with a metal gate structure. To perform the replacement gate process, the dummy gate structure is removed first, and the first and second semiconductor materials under the dummy gate structure are exposed. An etching process (e.g., a selective etching process) is performed to remove the first semiconductor material, and the second semiconductor material remains and forms a plurality of nanosheets, which function as the channel regions of the semiconductor device. An interfacial dielectric material is formed around each of the nanosheets. Next, a gate dielectric material is formed around the interfacial dielectric layer. Next, a first liner material (e.g., TiN) is formed around the gate dielectric material. Next, a work function material is formed around the first liner material. Next, a second liner material (e.g., TiN), which may be a same material as the first liner material, is formed around the work function material. A gate electrode material (e.g., a fill metal) is then formed around at least portions of the second liner material to form the gate electrode. The disclosed method prevents the work function material between adjacent nanosheets from merging together and forming a thicker layer of work functional material than the work function material at other locations. Since work functional material having non-uniform thickness may cause variations in the threshold voltage $V_{TH}$ of the device formed, the disclosed method avoids or reduces the variations in the threshold voltage $V_{TH}$ due to non-uniform thickness of the work function material, thereby improving the performance of the device formed.

FIG. 1 illustrates an example of a nanosheet field-effect transistor (NSFET) device in a three-dimensional view, in accordance with some embodiments. The NSFET device comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanosheets 54 are formed over the fins 90 and between source/drain regions 112. Isolation regions 96 are formed on opposing sides of the fins 90. A gate layer stack 120 (which may include, e.g., gate dielectric material, work function material) is formed around the nanosheets 54. Gate electrodes 122 are over and around the gate layer stack 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of an NSFET device. Cross-section B-B is perpendicular to cross-section A-A and is along a longitudinal axis of a fin and in a direction of, for example, a current flow between the source/drain regions 112 of the NSFET device. Cross-section C-C is parallel to cross-section B-B and between two neighboring fins. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5C, 6A-6C, 7A-7C, 8A, 8B, 9A, 9B, 10A, 10B, 11-14, 15A, and 15B are cross-sectional views of a nanosheet field-effect transistor (NSFET) device 100 at various stages of manufacturing, in accordance with an embodiment.

Figure 2:
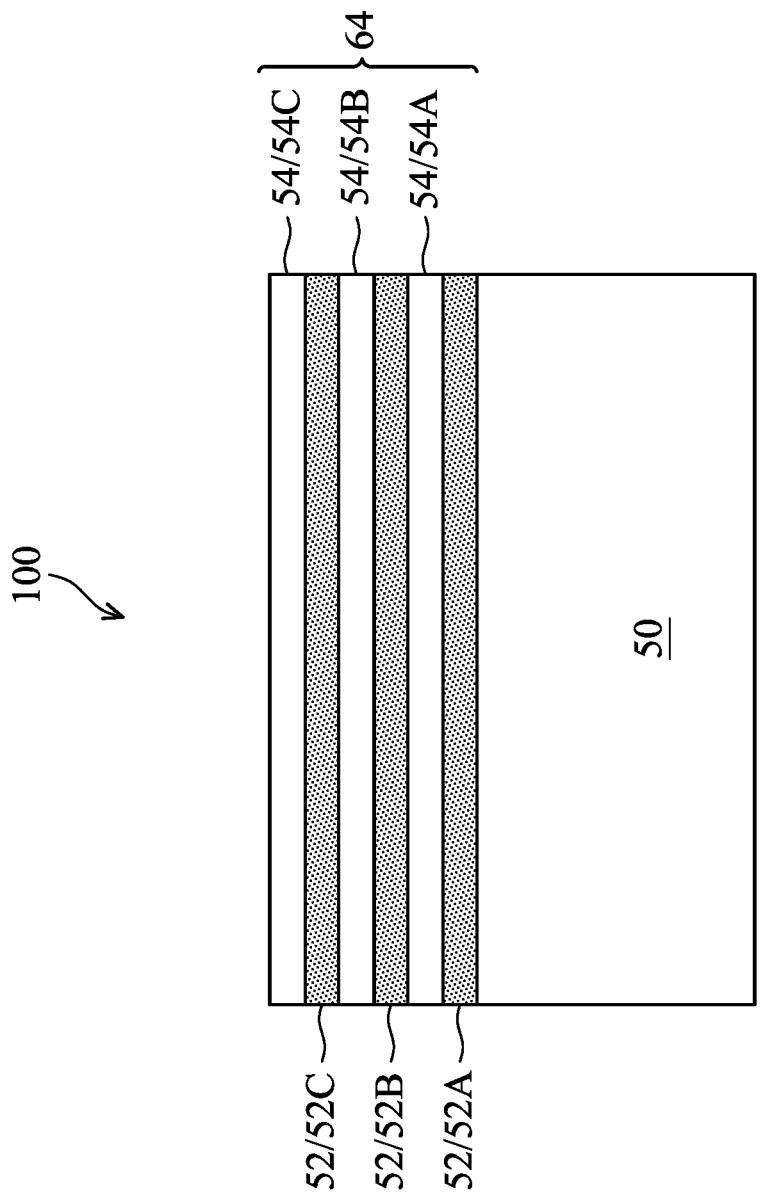

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of, e.g., p-type FETs, such as silicon germanium ($Si_xGe_{1-x}$, where x can be in the range of 0 to 1), and the second semiconductor material 54 is an epitaxial material appropriate for forming channel regions of, e.g., n-type FETs, such as silicon. The multi-layer stacks 64 (may also be referred to as an epitaxial material stack) will be patterned to form channel regions of an NSFET in subsequent processing. In particular, the multi-layer stacks 64 will be patterned to form horizontal nanosheets, with the channel regions of the resulting NSFET including multiple horizontal nanosheets.

The multi-layer stacks 64 may be formed by an epitaxial growth process, which may be performed in a growth chamber. In an embodiment, during the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

FIGS. 3A, 3B, 4A, 4B, 5A-5C, 6A-6C, 7A-7C, 8A, 8B, 9A, 9B, 10A, 10B, 11-14, 15A, and 15B are cross-sectional views of the NSFET device 100 at subsequent stages of manufacturing, in accordance with an embodiment. FIGS. 3A, 4A, 5A, 6A, 7A, 8A, 9A, 10A, and 15A are cross-sectional views along cross-section B-B in FIG. 1. FIGS. 3B, 4B, 5C, 6C, 7C, 8B, 9B, 10B, and 15B are cross-sectional views along cross-section A-A in FIG. 1. FIGS. 5B, 6B, and 7B are cross-sectional views along cross-section D-D in FIG. 1. FIGS. 11-14 are cross-sectional views of a portion of the NSFET device along cross-section A-A in FIG. 1. Although two fins and two gate structures are illustrated in the figures as a non-limiting example, it should be appreciated that other numbers of fins and other numbers of gate structures may also be formed.

Figure 3B:
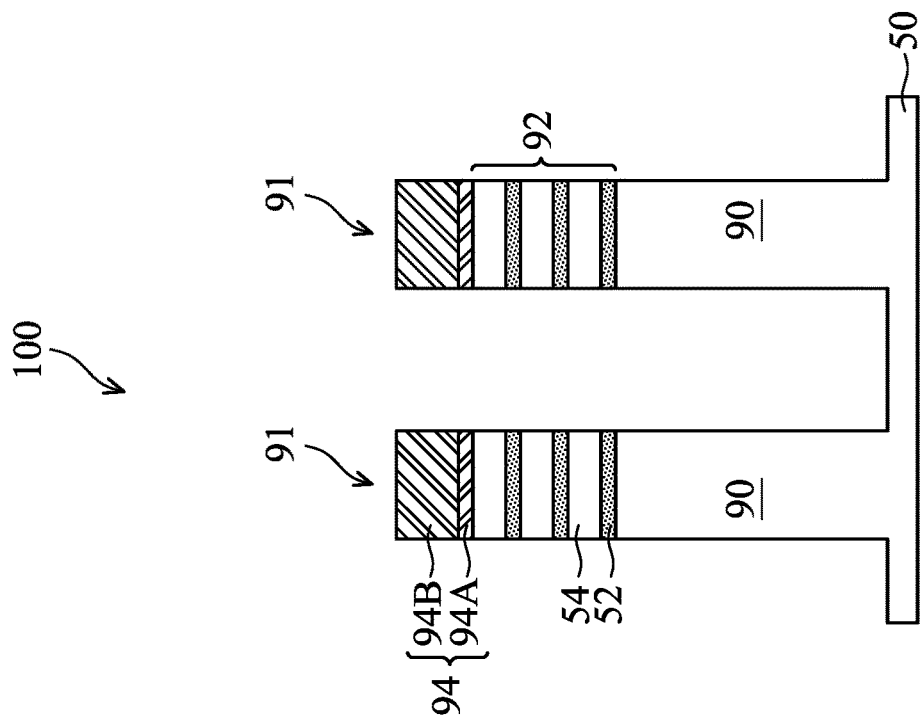
Figure 3A:
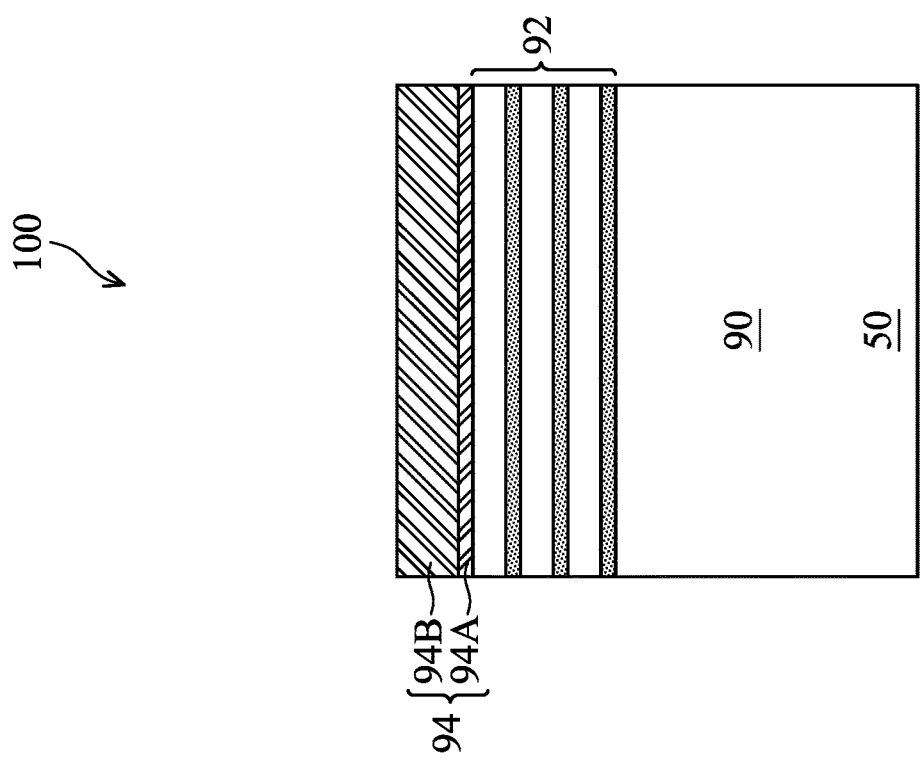

In FIGS. 3A and 3B, fin structures 91 are formed protruding above the substrate 50. Each of the fin structures 91 includes a semiconductor fin 90 and a nanostructure 92 overlying the semiconductor fin 90. The nanostructures 92 and the semiconductor fins 90 may be formed by etching trenches in the multi-layer stack 64 and the substrate 50, respectively.

The fin structures 91 may be patterned by any suitable method. For example, the fin structures 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structures 91.

In some embodiments, the remaining spacers are used to pattern a mask 94, which is then used to pattern the fin structures 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the nanostructures 92, and the patterned substrate 50 form the semiconductor fins 90, as illustrated in FIGS. 3A and 3B. Therefore, in the illustrated embodiment, the nanostructure 92 also includes alternating layers of the first semiconductor material 52 and the second semiconductor material 54, and the semiconductor fin 90 is formed of a same material (e.g., silicon) as the substrate 50.

Figure 4B:
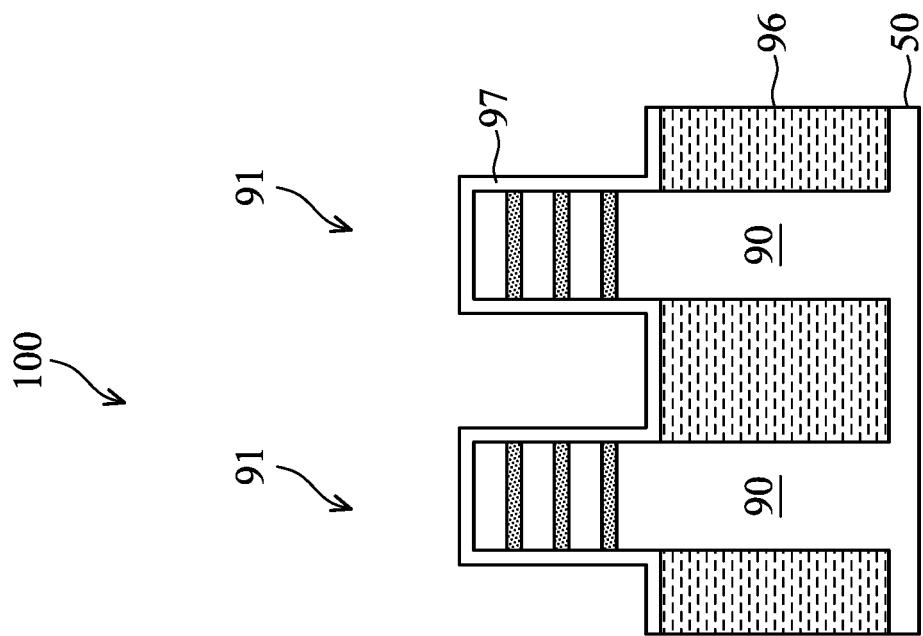
Figure 4A:
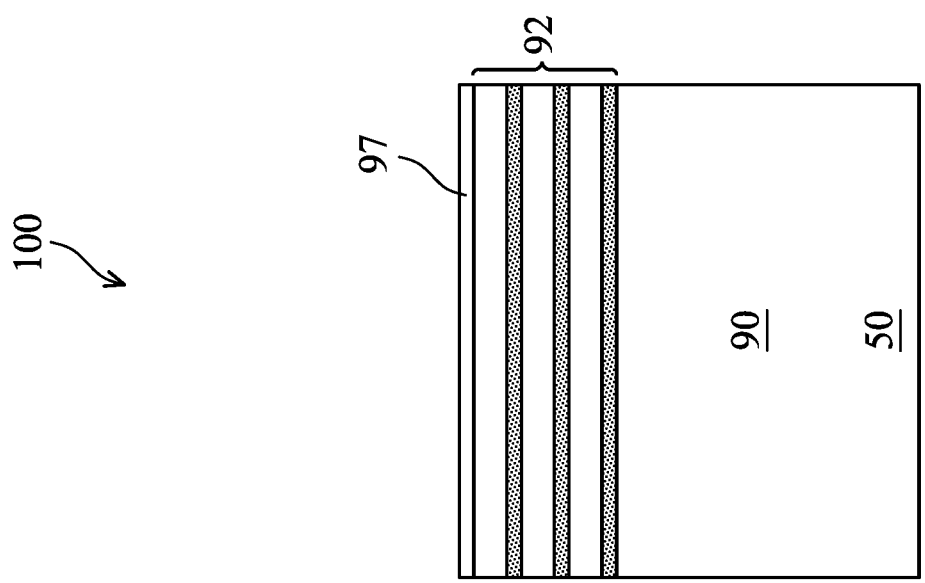

Next, in FIGS. 4A and 4B, Shallow Trench Isolation (STI) regions 96 are formed over the substrate 50 and on opposing sides of the fin structures 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like may be utilized. The planarization process exposes the nanostructures 92 such that top surfaces of the nanostructure 92 and the insulation material are level after the planarization process is complete. Next, the insulation material is recessed to form the STI regions 96. The insulation material is recessed such that the nanostructures 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the nanostructures 92). For example, a chemical oxide removal with a suitable etchant such as dilute hydrofluoric (dHF) acid may be used.

Still referring to FIGS. 4A and 4B, a dummy dielectric layer 97 is formed over the nanostructures 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the nanostructure 92 and over the upper surface of the STI regions 96, and a thermal oxidization process is performed to convert the deposited silicon layer into an oxide layer as the dummy dielectric layer 97.

Next, in FIGS. 5A-5C, dummy gates 102 are formed over the fins 90 and over the nanostructures 92. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (poly-silicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the nanostructures 92. The pattern of the masks 104 may be used to physically separate each of the dummy gates 102 from adjacent dummy gates. The dummy gates 102 may also have a lengthwise direction substantially perpendicular to the lengthwise direction of the fins 90. The dummy gate 102 and the dummy gate dielectric 97 are collectively referred to as dummy gate structure, in some embodiments.

Next, a gate spacer layer 108 is formed by conformally depositing an insulating material over the nanostructures 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A, but along cross-sections E-E and F-F in FIG. 5A, respectively. The cross-sections E-E and F-F correspond to cross-sections D-D and A-A in FIG. 1, respectively.

Next, in FIGS. 6A-6C, the gate spacer layers 108 are etched by an anisotropic etching process to form gate spacers 108. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric 97) forming the gate spacers 108.

FIGS. 6B and 6C illustrate cross-sectional views of the NSFET device 100 in FIG. 6A, but along cross-sections E-E and F-F, respectively. In FIG. 6B, portions of the gate spacer layer 108 are illustrated between neighboring fins on the upper surface of the STI regions 96. These portions of the gate spacer layer 108 may remain because the anisotropic etching process discussed above may not completely remove the gate spacer layer 108 disposed between neighboring fins, due to the small distance between the neighboring fins reducing the efficiency of the anisotropic etching process. In other embodiments, the portions of the gate spacers layers 108 disposed on the upper surface of the STI regions 96 between neighboring fins are completely removed by the anisotropic etching process.

After the formation of the gate spacers 108, implantation for lightly doped source/drain (LDD) regions (not shown) may be performed. Appropriate type (e.g., p-type or n-type) impurities may be implanted into the exposed nanostructures 92 and/or semiconductor fins 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ $cm^{-3}$ to about $10^{16}$ $cm^{-3}$. An anneal process may be used to activate the implanted impurities.

Next, openings 110 (may also be referred to as recesses) are formed in the nanostructures 92. The openings 110 may extend through the nanostructures 92 and into the semiconductor fins 90. The openings 110 may be formed by any acceptable etching technique, using, e.g., the dummy gates 102 as an etching mask.

After the openings 110 are formed, a selective etching process is performed to recess end portions of the first semiconductor material 52 exposed by the openings 110 without substantially attacking the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer also fills the recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers 55. FIGS. 6B and 6C illustrate cross-sectional views of the NSFET device 100 in FIG. 6A, but along cross-sections E-E and F-F in FIG. 6A, respectively.

Figure 7C:
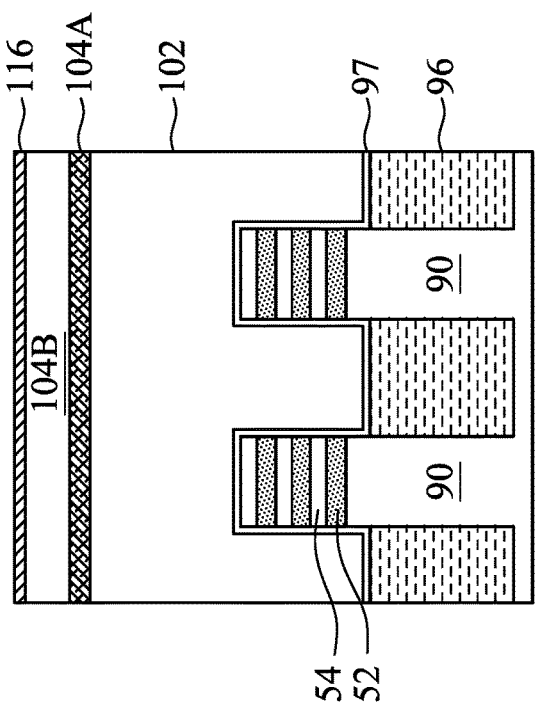
Figure 7A:
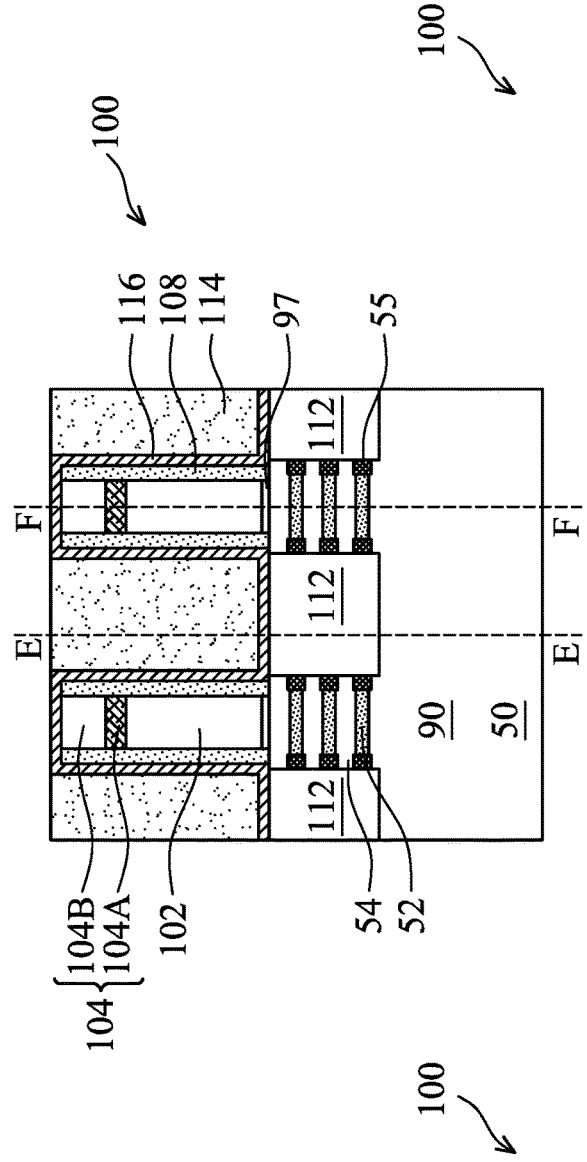
Figure 7B:
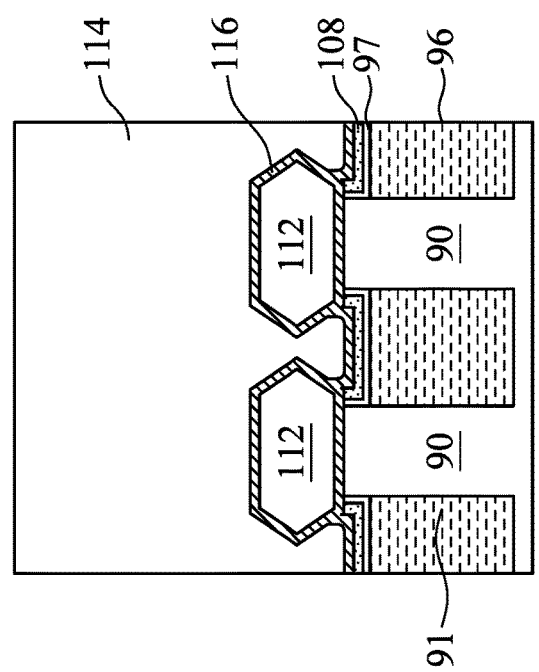

Next, in FIGS. 7A-7C, source/drain regions 112 are formed in the openings 110. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 90. In the illustrated embodiment, adjacent epitaxial source/drain regions 112 remain separated (see FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 7B and 7C illustrate cross-sectional views of the NSFET device 100 of FIG. 7A, but along cross-section E-E and F-F in FIG. 7A, respectively.

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 7A) on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed through the first ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. FIG. 8B illustrates the cross-sectional view of the NSFET device 100 of FIG. 8A, but along the cross-section F-F.

Figure 9A:
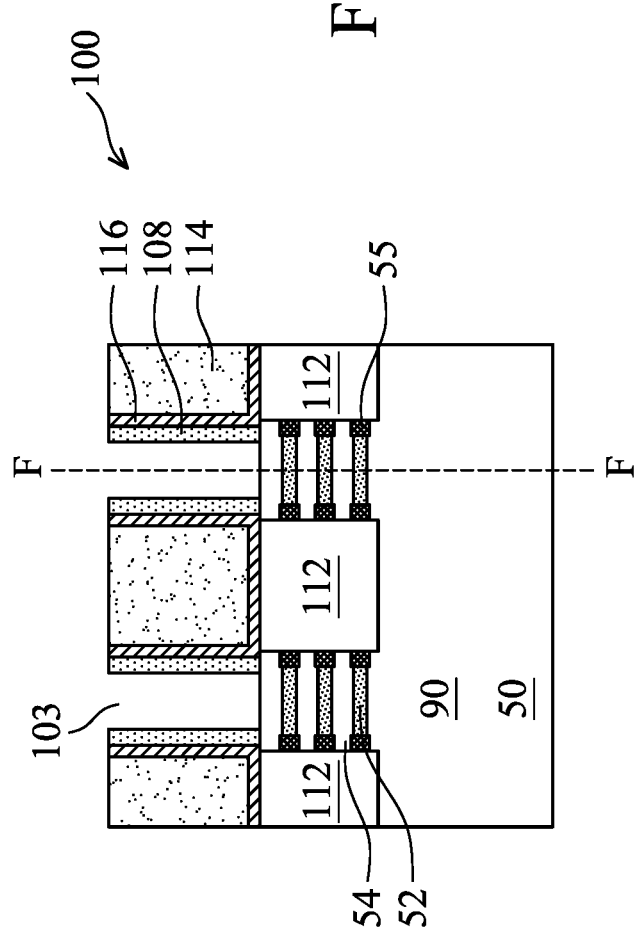
Figure 9B:
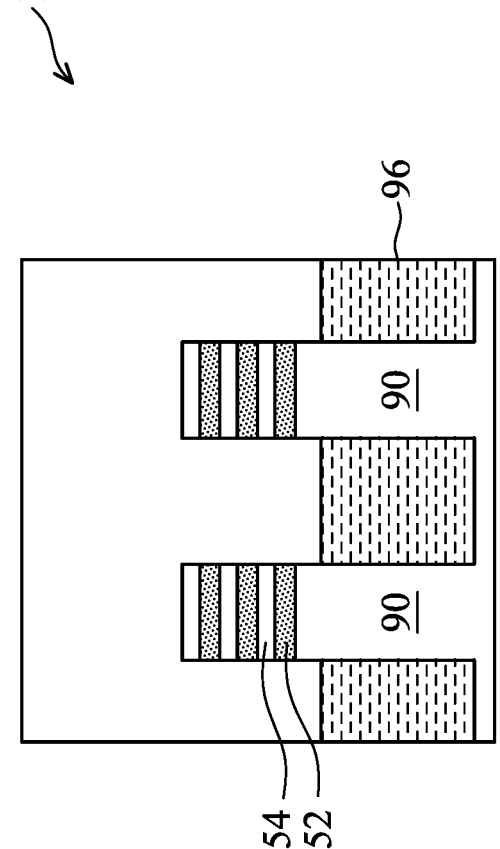

Next, in FIGS. 9A and 9B, the dummy gate dielectric 97 in the recesses 103 is removed. An etching process, such as an isotropic etching process, may be performed to remove the dummy gate dielectric 97. In an embodiment, an isotropic etching process using an etching gas that comprises HF and $NH_3$ is performed to remove the dummy gate dielectric 97.

Figure 10A:
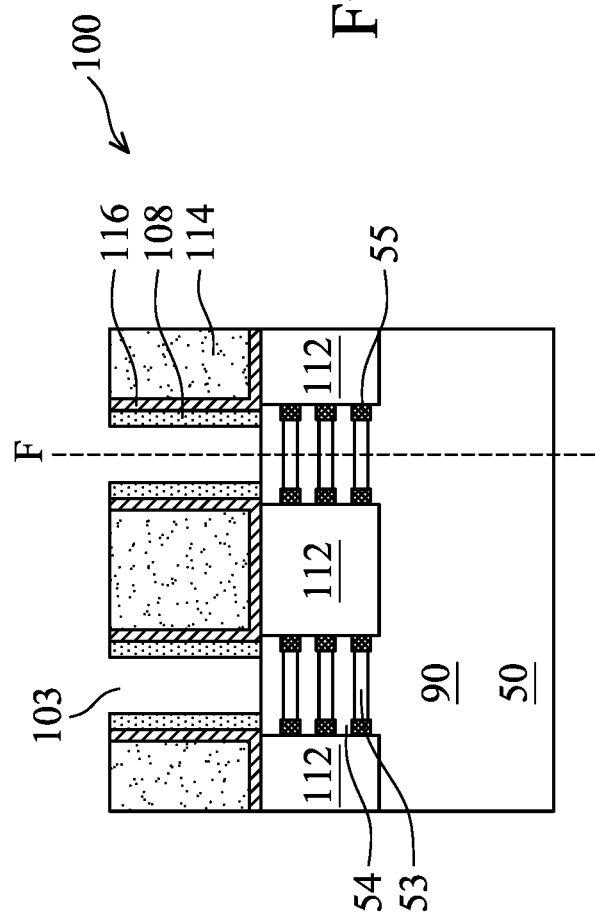
Figure 10B:
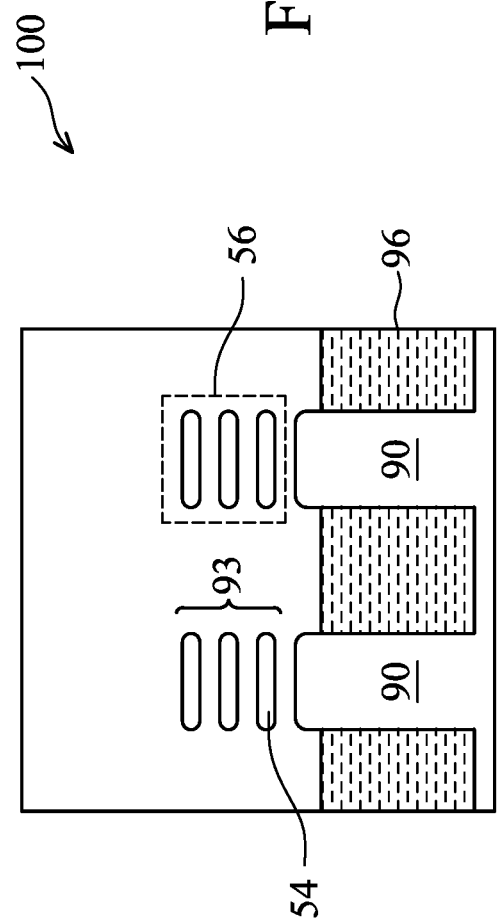

Next, in FIGS. 10A and 10B, the first semiconductor material 52 is removed to release the second semiconductor material 54. After the first semiconductor material 52 is removed, the second semiconductor material 54 forms a plurality of nanosheets 54 that extend horizontally (e.g., parallel to a major upper surface of the substrate 50). The nanosheets 54 may be collectively referred to as the channel regions 93 or the channel layers 93 of the NSFET device 100 formed. As illustrated in FIG. 10A, gaps 53 (e.g., empty spaces) are formed between the nanosheets 54 by the removal of the first semiconductor material 52.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas, where the etching gas comprises $F_2$ and HF, and the carrier gas may be an inert gas such as Ar, He, $N_2$, combinations thereof, or the like.

FIG. 10A illustrates the cross-sectional view of the NSFET device 100 along a longitudinal axis of the fin (e.g., along a current flow direction in the fin), and FIG. 10B illustrates the cross-sectional view of the NSFET device 100 along cross-section F-F, which is a cross-section along a direction perpendicular to the longitudinal axis of the fin and across a middle portion of the nanosheet 54.

FIGS. 11-14 illustrate subsequent processing steps to form a gate layer stack 120 (see, e.g., FIGS. 15A and 15B) around the nanosheets 54 and along sidewalls of the recesses 103, where the gate layer stack 120 includes an interfacial dielectric material 121, a gate dielectric material 123, a first liner material 125, a work function material 127, and a second liner material 129, in the illustrated embodiment. For simplicity, FIGS. 11-14 illustrate the cross-sectional views of a portion of the NSFET device 100 within an area 56 of FIG. 10B.

Figure 11:
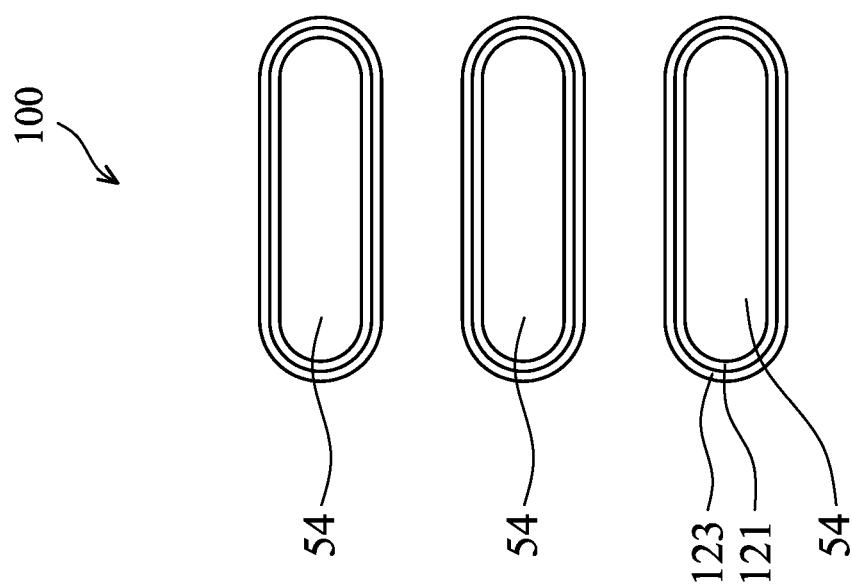

Referring next to FIG. 11, an interfacial dielectric material 121 and a gate dielectric material 123 are successively formed around each of the nanosheets 54. Although not illustrated in FIGS. 11-14 (but illustrated in FIG. 15B), the different constituent materials of the gate layer stack 120 are also formed over the exposed surfaces of the fins 90 and over the upper surface of the STI regions 96, as illustrated in FIG. 15B, in the illustrated embodiment.

The interfacial dielectric material 121 is a suitable dielectric material, such as silicon oxide formed by a suitable method, such as CVD, PVD, ALD, thermal oxidation, or the like. In an embodiment, the interfacial dielectric material 121 is formed by converting an exterior portion of the nanosheets 54 (e.g., silicon) into an oxide (e.g., silicon oxide) through a thermal oxidization process. A thickness of the interfacial dielectric material 121 is between about 5 angstroms and about 20 angstroms, as an example.

Next, the gate dielectric material 123 is formed (e.g., conformally) around the nanosheets 54 and around the interfacial dielectric material 121. In accordance with some embodiments, the gate dielectric material 123 comprises silicon oxide, silicon nitride, or multilayers thereof. In some embodiments, the gate dielectric material 123 includes a high-k dielectric material, and in these embodiments, the gate dielectric material 123 may have a k value greater than about 7.0, and may include a metal oxide or a silicate of Hf, Al, Zr, La, Mg, Ba, Ti, or Pb, or combinations thereof. The formation methods of the gate dielectric material 123 may include Molecular-Beam Deposition (MBD), ALD, PECVD, and the like. As an example, the gate dielectric material 123 is $HfO_2$ formed by ALD, and has a thickness between about 10 angstroms and about 30 angstroms.

Figure 12:
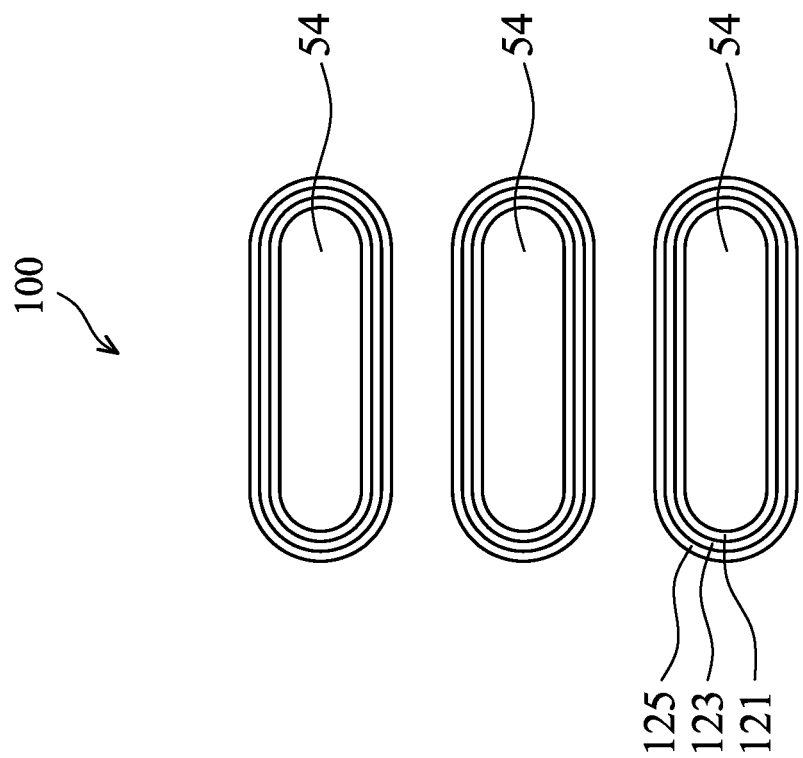

Next, in FIG. 12, the first liner material 125 is formed (e.g., conformally) around the nanosheets 54 and around the gate dielectric material 123. In an embodiment, the first liner material 125 is titanium nitride (TiN), and is formed by ALD. Besides titanium nitride, other suitable materials, such as tantalum nitride (TaN), titanium carbide (TiC), or the like, may also be used as the first liner material 125, and other suitable deposition methods, such as CVD, PVD, or the like, may also be used to form the first liner material 125. In some embodiments, the first liner material 125 (or the subsequently formed second liner material 129) is an electrically conductive material with good thermal stability. For example, the crystal phase of the first liner material 125 (or the second liner material 129) should remain stable (e.g., uniform) at a high temperature, e.g., between about 300° C. and about 600° C., such that diffusion of certain element (e.g., aluminum) in the subsequently formed work function material 127 is prevented or reduced. In some embodiments, a thickness of the first liner material 125 (or the second liner material 129) is larger than about 10 angstroms and smaller than about half the thickness of the work function material 127. The thickness of the first liner material 125 (or the second liner material 129) is chosen to be thick enough (e.g., >10 angstroms) such that a continuous layer (e.g., without pin holes) is formed to provide protection against diffusion of, e.g., aluminum in the work function material 127. At the same, the thickness of the first liner material 125 (or the second liner material 129) is chosen to leave enough space between adjacent nanosheets 54 for formation of other layers (e.g., the work function material 127 and the second liner material 129). The above disclosed range for the thickness for the first liner material 125 (or the second liner material 129) ensures formation of a continuous layer without pin holes, and leaves enough space between adjacent nanosheets 54 such that the thickness of the work function material 127 may be tuned (e.g., changed) to achieve a target threshold voltage for the device formed.

Figure 13:
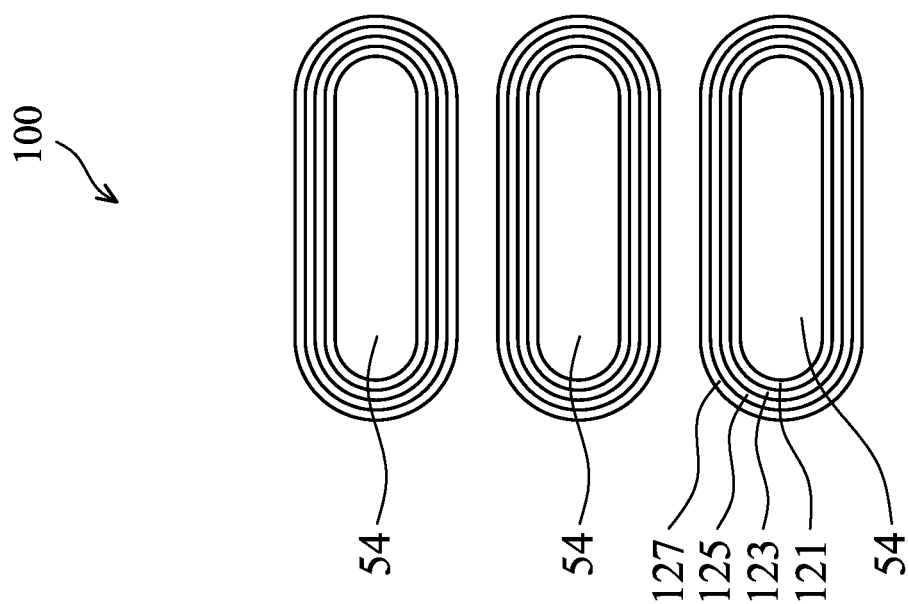

Next, in FIG. 13, the work function material 127 is formed around the nanosheets 54 and around the first liner material 125. Exemplary p-type work function materials (may also be referred to as p-type work function metals) include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function material, and thus, the work function material is chosen to tune its work function value so that a target threshold voltage $V_{TH}$ is achieved in the device that is to be formed. The work function material(s) may be deposited by ALD, CVD, physical vapor deposition (PVD), and/or other suitable process. In an embodiment, the NSFET device 100 is an n-type device, and the work function material 127 is titanium aluminum carbide (TiAlC) formed by ALD. A thickness of the work function material 127 is between about 10 angstroms and about 30 angstroms, as an example.

Figure 14:
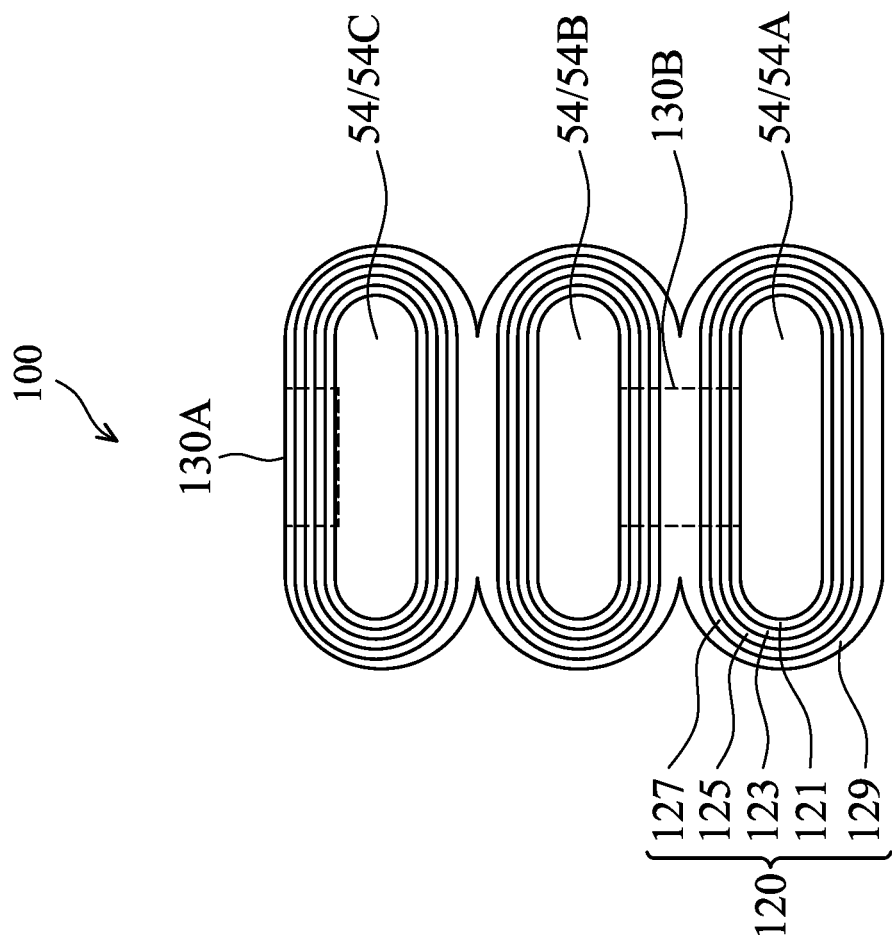

Next, in FIG. 14, the second liner material 129 is formed around the nanosheets 54 and around the work function material 127. Suitable materials for the second liner material 129 include titanium nitride (TiN), tantalum nitride (TaN), tungsten nitride (WN), tungsten carbonitride (WCN), and the like. In the illustrated embodiment, the second liner material 129 is formed of a same material as the first liner material 125, such as titanium nitride. In other embodiments, the second liner material 129 is formed of a different material from the first liner material 125. Any suitable formation method, such as ALD, PVD, CVD, or the like, may be used to form the second liner material 129. A thickness of the second liner material 129 is larger than about 10 angstroms and smaller than about half the thickness of the work function material 127, in some embodiments. The interfacial dielectric material 121, the gate dielectric material 123, the first liner material 125, the work function material 127, and the second liner material 129 are collectively referred to as a gate layer stack 120 in the discussion herein.

In the example of FIG. 14, the second liner material 129 between adjacent nanosheets 54 merges together (e.g., physically contacts each other). For example, in area 130B of FIG. 14, which is an area between adjacent nanosheets 54, the gate layer stack 120 completely fills the space between adjacent nanosheets 54. As a result, the subsequently formed gate electrode 122 (see FIG. 15B) does not extend into the space between adjacent nanosheets 54. In other words, the space between adjacent nanosheets 54 is free of the gate electrode material. A list of the layers of materials between two adjacent nanosheets 54 (e.g., 54B and 54C) therefore includes: a layer of the interfacial dielectric material 121, a layer of the gate dielectric material 123, a layer of the first liner material 125, a layer of the work function material 127, a layer of the (merged) second liner material 129, a layer of the work function material 127, a layer of the first liner material 125, a layer of the gate dielectric material 123, and a layer of the interfacial dielectric material 121.

Still referring to FIG. 14, note that in area 130A, which is an area over an uppermost nanosheet 54 (e.g., 54C) distal from the fin 90, the gate layer stack 120 has a first thickness, while in area 130B, the gate layer stack 120 has a second thickness larger than the first thickness, where the second thickness is about twice of the first thickness. This is because, as discussed above, in the area 130B, the gate layer stack 120 around two adjacent nanosheets 54 merge (e.g., in physically contact) and form a thicker (merged) gate layer stack 120. In addition, since the second liner material 129 between adjacent nanosheets 54 are merged together, the second liner material 129 between adjacent nanosheets 54 (e.g., in area 130B) are about twice as thick as the second liner material 129 at other locations (e.g., in area 130A).

By forming the second liner material 129 around the work function material 127, the work function material 127 around two adjacent nanosheets 54 are separated from each other, and each layer of the work function material 127 around a respective nanosheet 54 remains a conformal layer with a substantially uniform thickness (e.g., uniform within the constraints of manufacturing processes). In some embodiments, the aluminum in the work function material 127 plays an important role in determining the threshold voltage $V_{TH}$ of the NSFET device 100. Without the currently disclosed method (e.g., without the second liner material 129), the work function material 127 between two adjacent nanosheets 54 may merge together and form a thicker layer of work function material 127 in the area 130B than in, e.g., the area 130A, which may results in threshold voltage variation in the device formed. In contrast, the currently disclosed method prevents merging of the work function material 127 between adjacent nanosheets 54, and forms a layer of the work function material 127 around each nanosheet 54 with substantially uniform thickness. As a result, threshold voltage variation is avoided or reduced.

The second liner material 129 further functions to prevents or reduces the movement (e.g., diffusion) of the aluminum contained within the work function material 127 (e.g., TiAlC), thus may also be referred to as a barrier layer. Besides preventing the movement of aluminum, the first liner material 125 also improves the capacitance equivalent thickness (CET), thereby advantageously reducing the capacitance of the device formed.

Figure 15A:
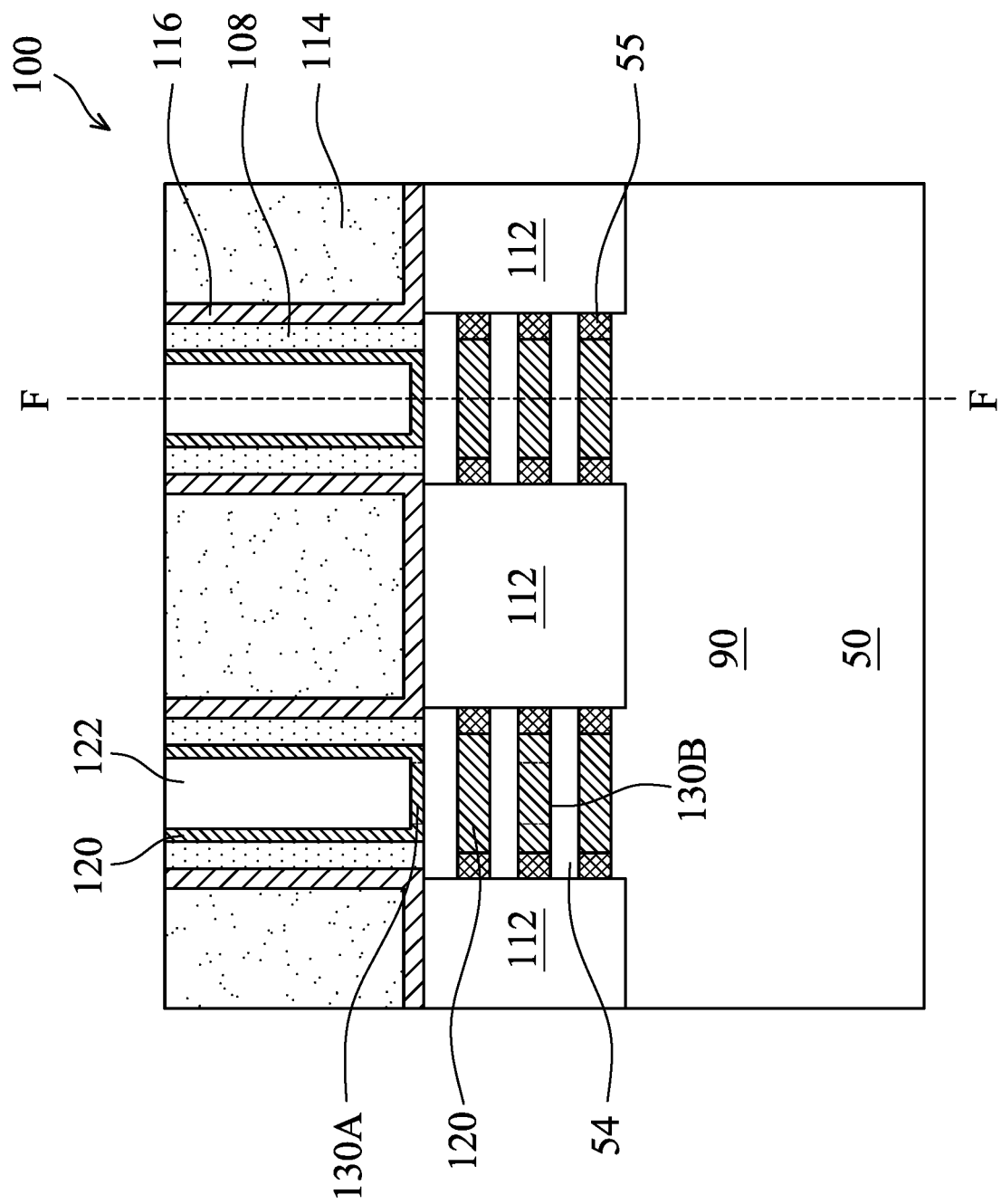
Figure 15B:
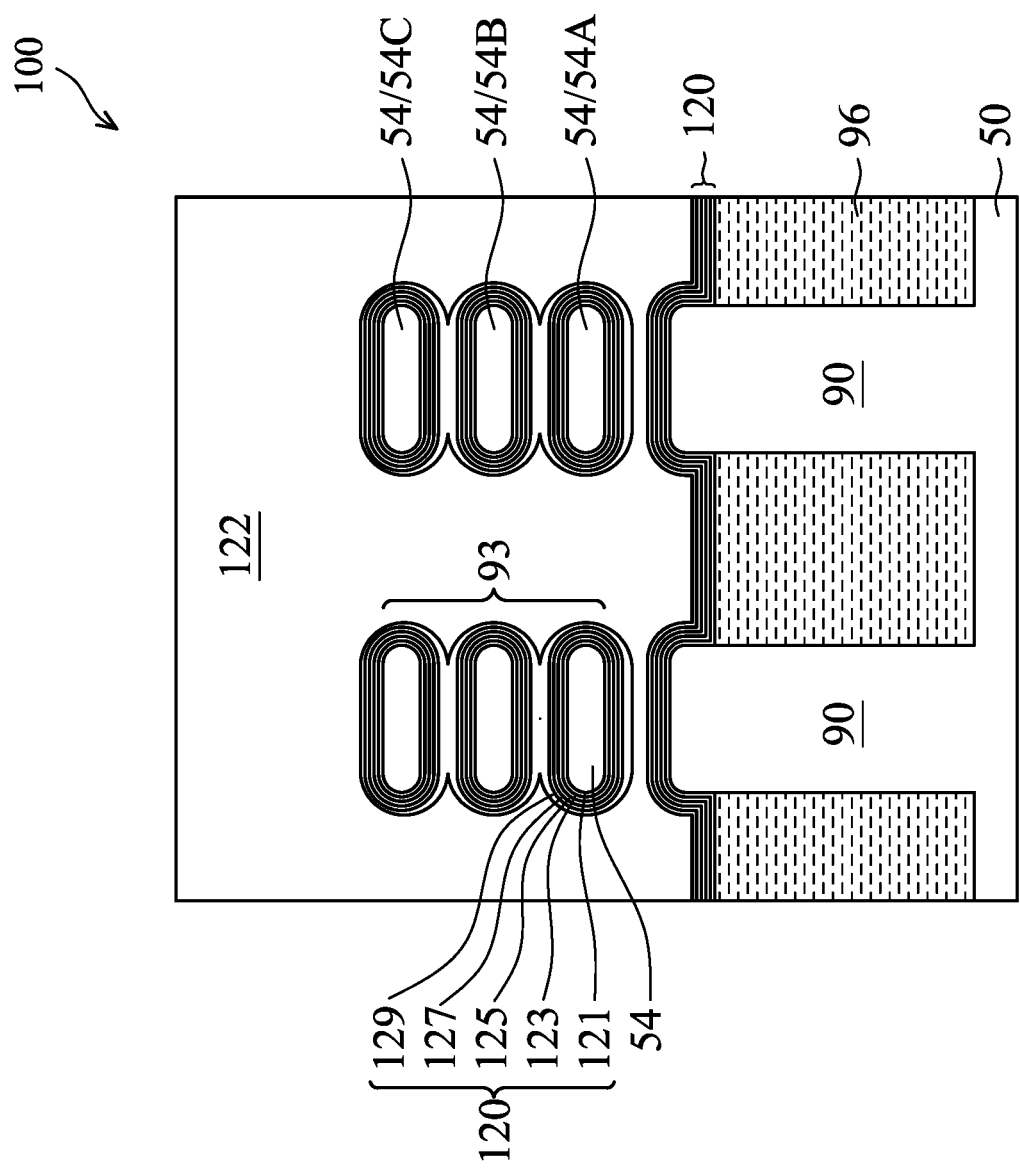

Next, in FIGS. 15A and 15B, a gate electrode material (e.g., an electrically conductive material) is formed in the recesses 103 to form the gate electrodes 122. The gate electrodes 122 fill the remaining portions of the recesses 103. The gate electrodes 122 may include a metal-containing material such as TiN, TiO, TaN, TaC, Co, Ru, Al, W, combinations thereof, or multi-layers thereof. After the filling of the gate electrodes 122, a planarization process, such as a CMP, may be performed to remove the excess portions of the gate layer stack 120 and the material of the gate electrodes 122, which excess portions are over the top surface of the first ILD 114. The remaining portions of material of the gate electrodes 122 and the gate layer stack 120 thus form replacement gates of the resulting NSFET device 100. Each gate electrode 122 and the corresponding gate layer stack 120 may be collectively referred to as a gate stack, a replacement gate structure, or a metal gate structure. Each gate stack extends around the respective nanosheets 54.

Note that for simplicity, the various constituent materials of the gate layer stack 120 are not illustrated in FIG. 15A, but shown in FIG. 15B, which is a cross-sectional view of the NSFET device 100 along cross-section F-F of FIG. 15A. In FIG. 15A, the areas 130A and 130B, which correspond to the areas 130A and 130B in FIG. 14, are also illustrated. As illustrated in FIG. 15B, the gate layer stack 120 further completely fills the space between the lowermost nanosheet 54 (e.g., 54A) and the fin 90, and the gate electrode 122 extends around at least portions of the gate layer stack 120.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed through the second ILD and/or the first ILD 114 to electrically couple to the gate electrode 122 and the source/drain regions 112, respectively.

Figure 16A:
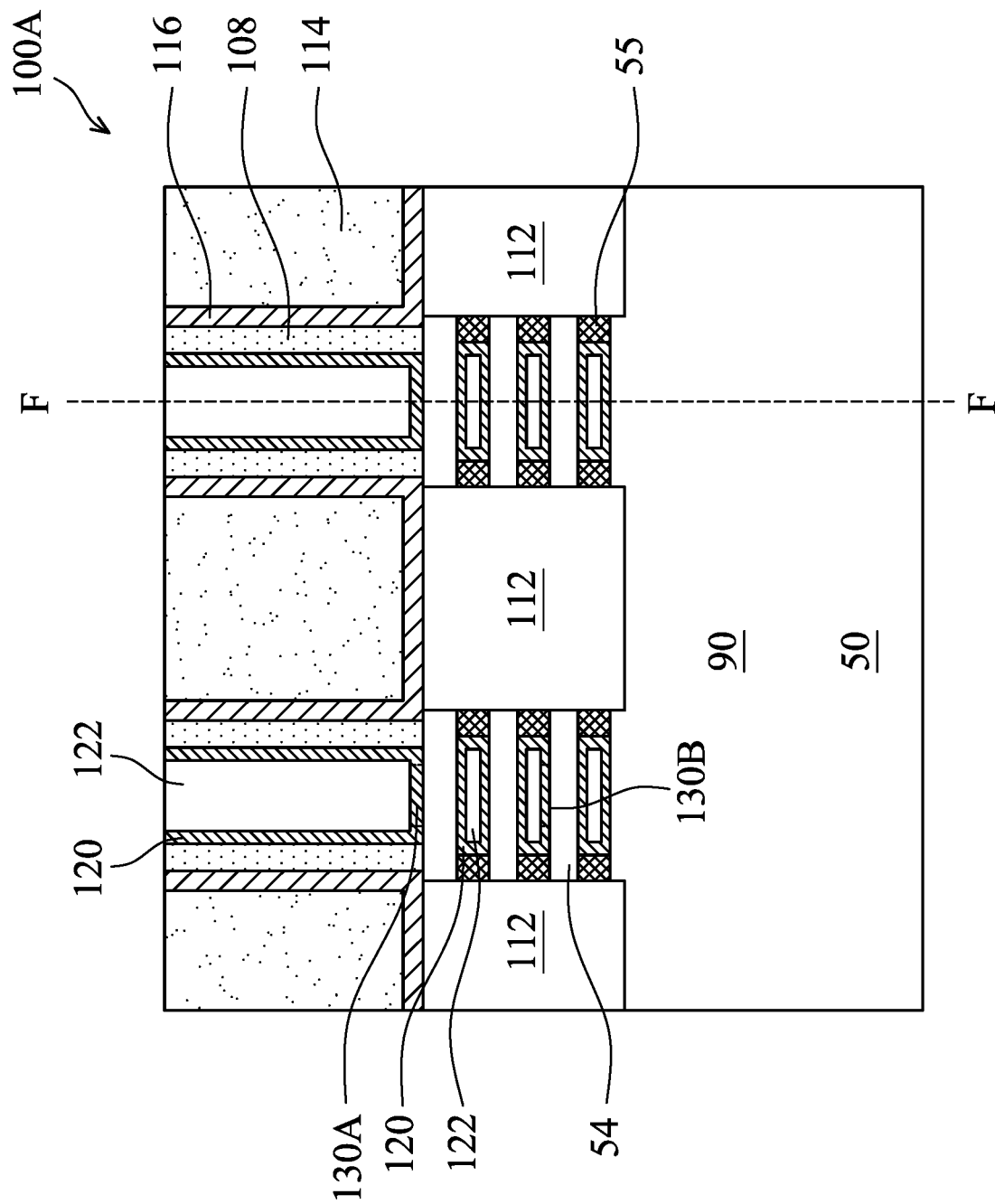
FIGS. 16A and 16B are cross-sectional views of a nanosheet field-effect transistor device at certain stage of manufacturing, in accordance with another embodiment.
Figure 16B:
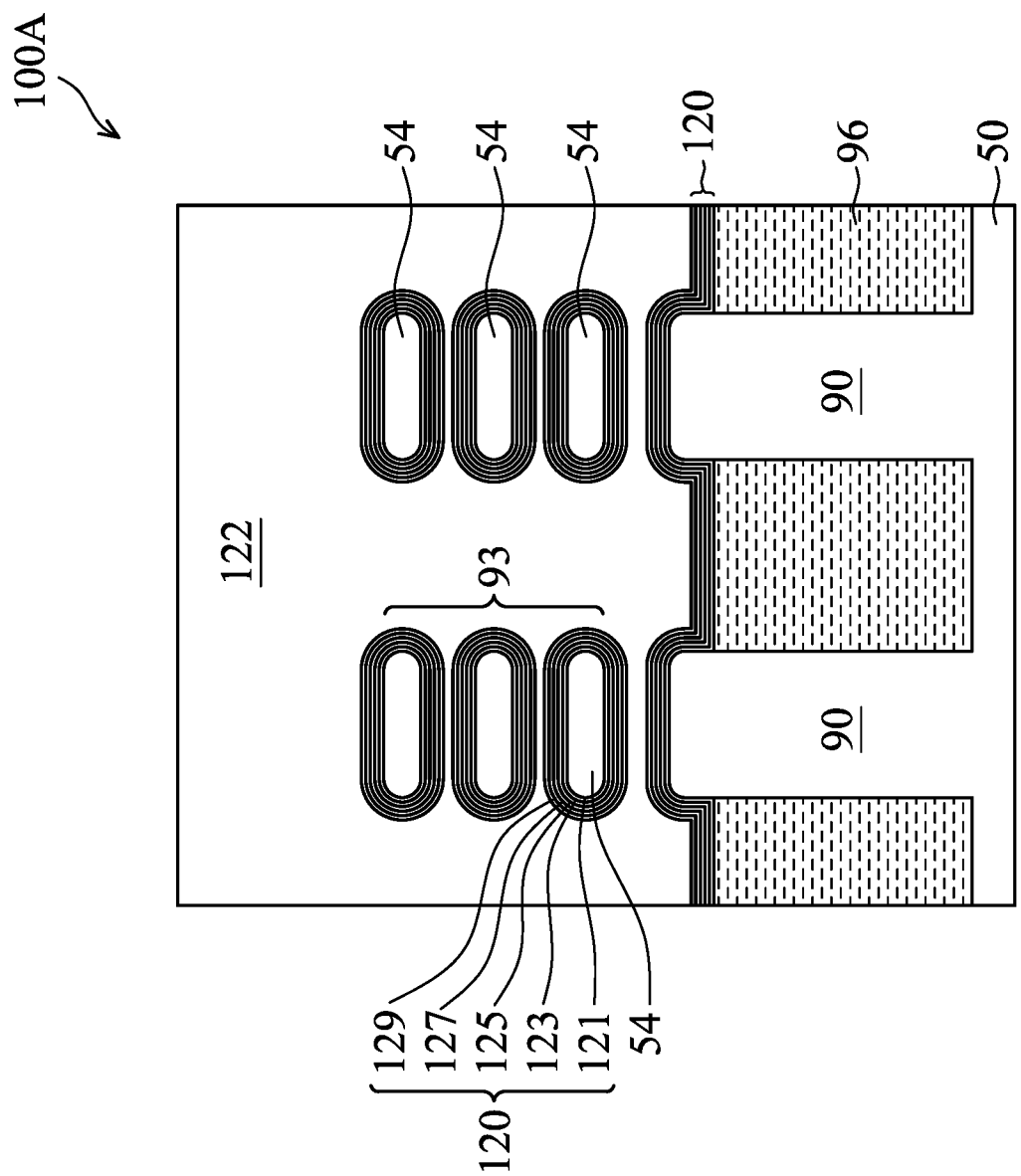

FIGS. 16A and 16B are cross-sectional views of a nanosheet field-effect transistor device 100A at certain stage of manufacturing, in accordance with another embodiment. The NSFET device 100A is similar to the NSFET device 100 of FIGS. 15A and 15B, but the gate layer stack 120 in FIGS. 16A and 16B does not completely fill the space between adjacent nanosheets 54 or the space between the lowermost nanosheet 54 and the fin 90. As a result, the gate electrode 122 extends into these spaces, as illustrated in FIGS. 16A and 16B. In addition, the gate layer stack 120 in the area 130A and the area 130B in FIG. 16A has a substantially same thickness.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanosheets, which nanosheets function as the channel regions of the NSFET device formed. In embodiments where the first semiconductor material 52 remain to form the nanosheets, inner spacers are formed in recesses in end portions of the second semiconductor material 54 before the second semiconductor material 54 is removed, as one of ordinary skill readily appreciates.

Figure 17:
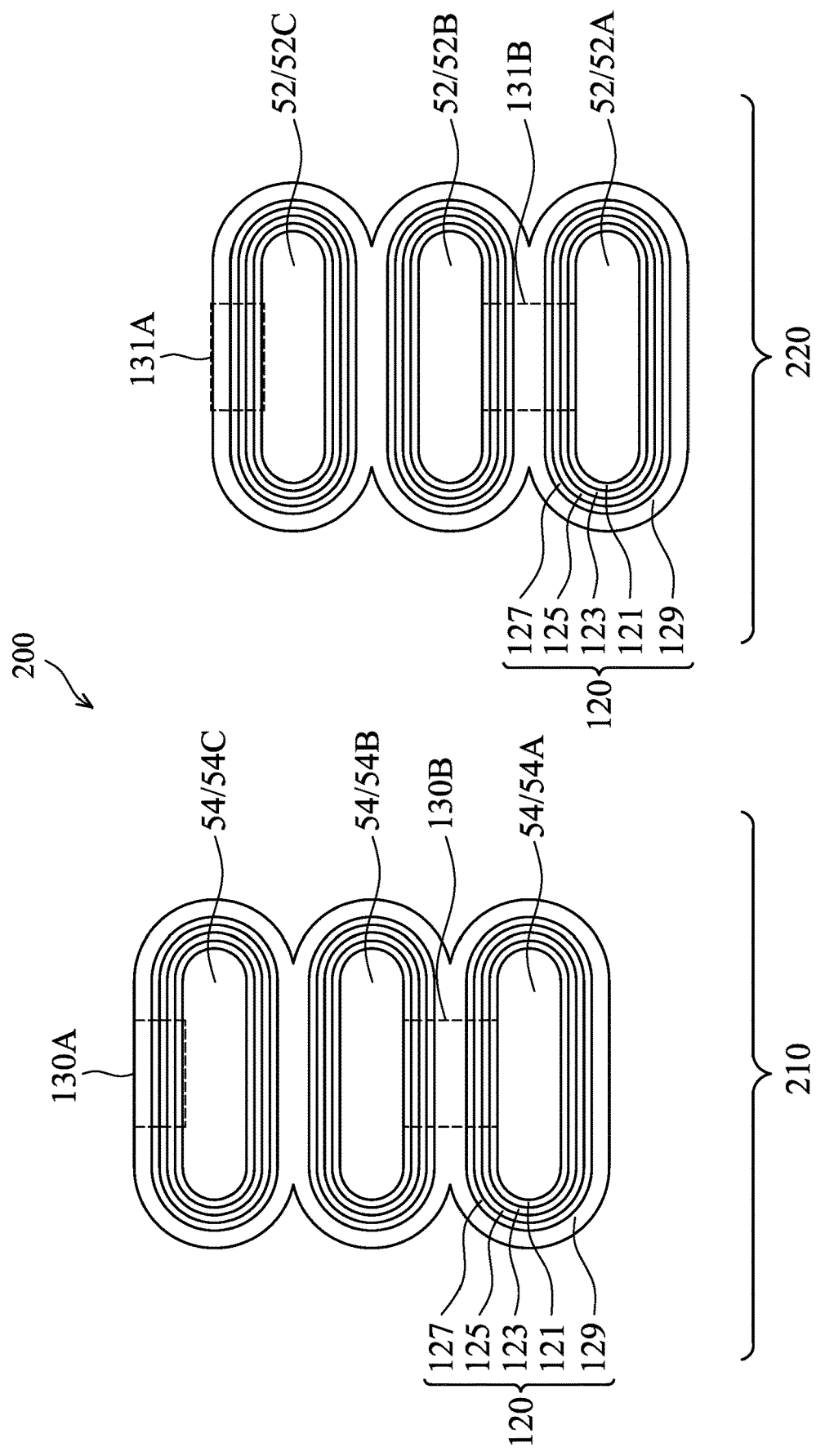
FIGS. 17, 18, 19A, and 19B are cross-sectional views of a nanosheet field-effect transistor device at various stages of manufacturing, in accordance with yet another embodiment.

FIGS. 17, 18, 19A, and 19B are cross-sectional views of a nanosheet field-effect transistor (NSFET) device 200 at various stages of manufacturing, in accordance with yet another embodiment. Referring to FIG. 17, the NSFET device 200 is similar to the NSFET device 100 in FIG. 14, but the NSFET device 200 has an n-type device region 210 and a p-type device region 220. In the illustrated embodiment, the structure (e.g., nanosheets 54 with gate layer stack 120) in the n-type device region 210 of FIG. 17 is the same as the structure illustrated in FIG. 14, and is formed following the same processing steps illustrated in FIGS. 3A, 3B, 4A, 4B, 5A-5C, 6A-6C, 7A-7C, 8A, 8B, 9A, 9B, 10A, 10B, and 11-14 for forming the structure in FIG. 14. In addition, FIG. 17 further illustrates a structure (nanosheets 52 and gate layer stack 120) formed in the p-type device region 220, which structure is formed in similar processing steps as the structure in the n-type device region 210. For example, since p-type channel region is formed in the p-type device region 220, the second semiconductor material 54 (e.g., Si) is removed to release the first semiconductor material 52 (e.g., SiGe) to form the nanosheets 52. In addition, the inner spacers 55 (see FIG. 19B) are formed between nanosheets 52 in the p-type device region 220. The processing illustrated in FIGS. 6A-6C, 7A-7C, 8A, 8B, 9A, 9B, 10A and 10B can be adapted to form the nanosheets 52, thus details are not discussed. In FIG. 17, the area 131B defines an area between adjacent nanosheets 52, and the area 131A defines an area above an uppermost nanosheet 52.

In an embodiment, to from the NSFET device 200, the processing steps illustrated in FIGS. 2, 3A, 3B, 4A, 4B, and 5A-5C are performed for both the n-type device region 210 and the p-type device region 220. Next, the p-type device region 220 is covered by a first patterned mask layer (e.g., a patterned photoresist) while the processing steps shown in FIGS. 6A-6C, 7A-7C, 8A, 8B, 9A, 9B, 10A and 10B are performed for the n-type region 210 to form the nanosheets 54. Next, the first patterned mask layer is removed, the n-type device region 210 is covered with a second patterned mask layer, and similar processing steps (e.g., similar to those shown in FIGS. 6A-6C, 7A-7C, 8A, 8B, 9A, 9B, 10A and 10B but adjusted to form nanosheets 52) are performed for the p-type device region 220 to form the nanosheets 52. Next, the second patterned mask layer is removed, and the processing steps illustrated in FIGS. 11-14 are performed for both the n-type device region 210 and the p-type device region 220 to from the structure shown in FIG. 17.

Figure 18:
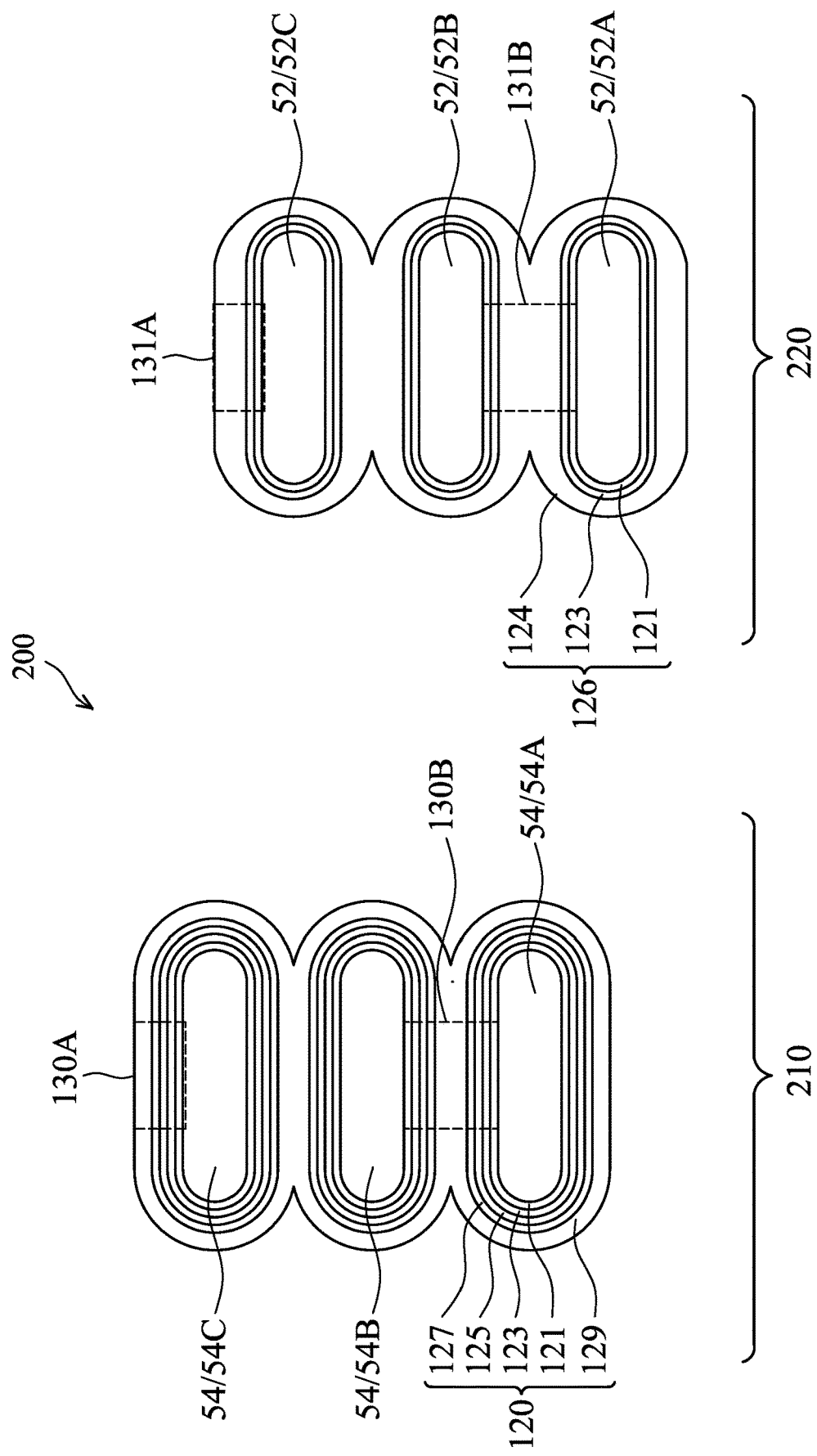

Next, in FIG. 18, a third patterned mask layer is formed to cover the n-type device region 210, and one or more etching processes are performed to remove the second liner material 129, the work function material 127, and the first liner material 125, such that the gate dielectric material 123 around the nanosheets 52 is exposed. Next, a work function material 124, such as a p-type work function material (e.g., TiN), is formed around the nanosheet 52 and around the gate dielectric material 123. After the work function material 124 is formed, the third patterned mask layer is removed. The interfacial dielectric material 121, the gate dielectric material 123, and the work function material 124 form the gate layer stack 126 for the p-type device region 220.

Note that in the example of FIG. 18, the work function material 124 between adjacent nanosheets 52 (in the area 131B) are merged together. Therefore, the thickness of the work function material 124 in the area 131B may be twice or more as the thickness of the work function material 124 in the area 131A. A list of the layers of materials between two adjacent nanosheets 52 (e.g., 52A and 52B) therefore includes: a layer of the interfacial dielectric material 121, a layer of the gate dielectric material 123, a layer of the (merged) work function material 124, a layer of the gate dielectric material 123, and a layer of the interfacial dielectric material 121. In the illustrated embodiment, the work function material 124 (e.g., a p-type work function material such as TiN) does not contain aluminum (which diffuse easily), and therefore, the first linear material 125 and the second liner material 129 are not used in the p-type device region 220. The increased space between adjacent nanosheets 52 allows more flexibility in tuning the structure of the work function material 124, such as the number of sublayers in the work function material 124 and the thicknesses of the sublayers. Note that although the work function layer 124 (or 127) is illustrated as a single layer in the figures, the work function layer 124 (or 127) may have a multi-layer structure with a plurality of sublayers.

Figure 19A:
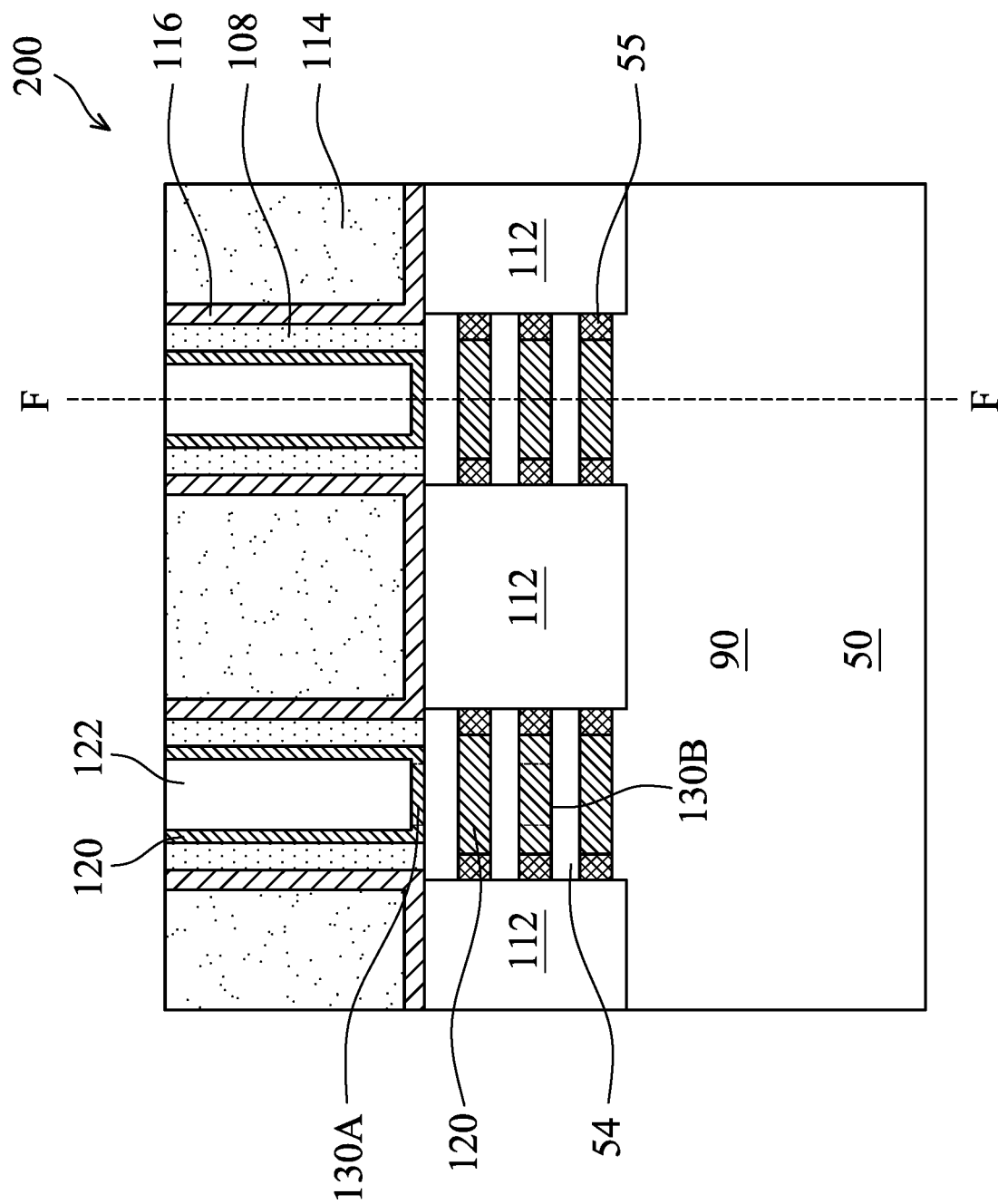
Figure 19B:
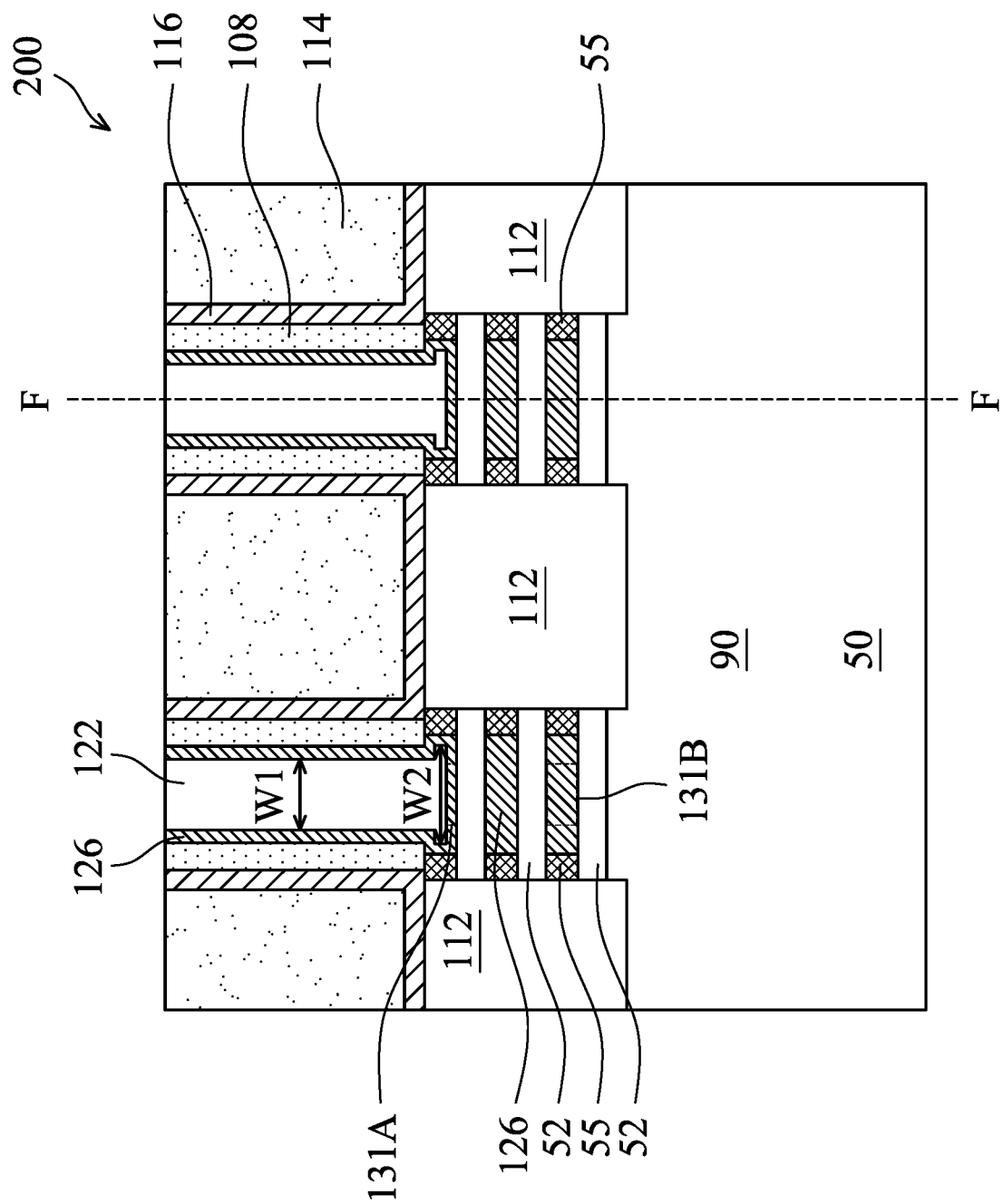

Next, as illustrated in FIGS. 19A and 19B, the gate electrode 122 is formed around the nanosheets 54/52 and around the layer stacks 120/126. FIG. 19A illustrates the cross-sectional view of the NSFET device 200 along a longitudinal direction of a fin in the n-type device region 210, and FIG. 19B illustrates the cross-sectional view of the NSFET device 200 along a longitudinal direction of a fin in the p-type device region 220.

In the illustrated embodiment, the cross-sectional view of FIG. 19A is the same as the cross-sectional view of FIG.

15A, thus details are not repeated. In FIG. 19B, the gate stack layer 126 fills the space between adjacent nanosheets 52 in the p-type device region 220, and therefore, there is no gate electrode 122 between adjacent nanosheets 52 in FIG. 19B. In addition, due to the gate electrode 122 filling the space left by the removal of the topmost layer of the second semiconductor material 54, the gate electrode 122 has a first width W1 measured between gate spacers 108, and has a second width W2 measured between the topmost inner spacers 55, where W2 is larger than W1.

Figure 20:
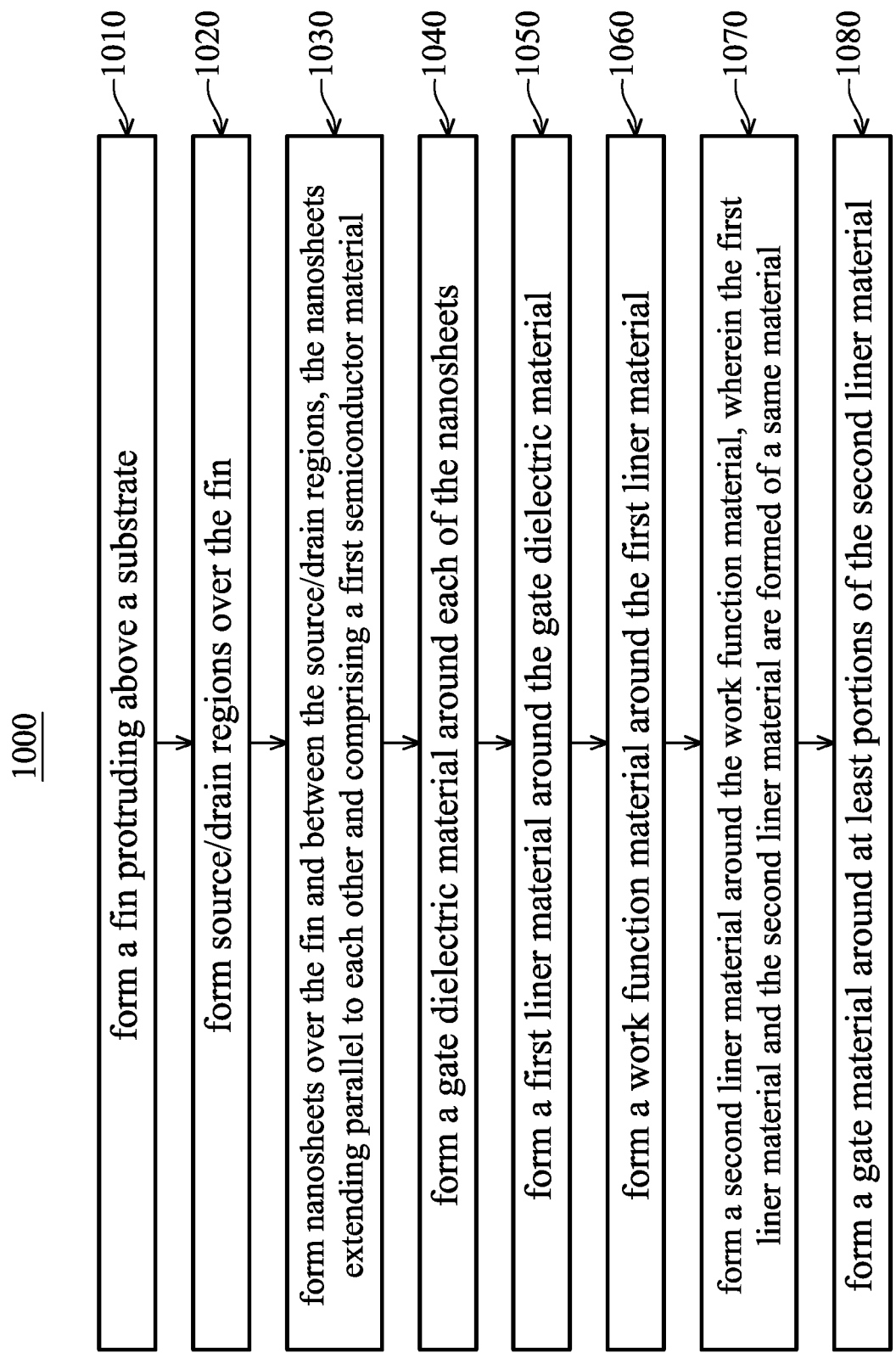
FIG. 20 is a flow chart of a method of forming a semiconductor device, in some embodiments.

FIG. 20 illustrates a flow chart of a method of fabricating a semiconductor device, in accordance with some embodiments. It should be understood that the embodiment method shown in FIG. 20 is merely an example of many possible embodiment methods. One of ordinary skill in the art would recognize many variations, alternatives, and modifications. For example, various steps as illustrated in FIG. 20 may be added, removed, replaced, rearranged, or repeated.

Referring to FIG. 20, at block 1010, a fin is formed protruding above a substrate. At block 1020, source/drain regions are formed over the fin. At block 1030, nanosheets are formed over the fin and between the source/drain regions, the nanosheets extending parallel to each other and comprising a first semiconductor material. At block 1040, a gate dielectric material is formed around each of the nanosheets. At block 1050, a first liner material is formed around the gate dielectric material. At block 1060, a work function material is formed around the first liner material. At block 1070, a second liner material is formed around the work function material, wherein the first liner material and the second liner material are formed of a same material. At block 1080, a gate material is formed around at least portions of the second liner material.

Embodiments may achieve advantages. The disclosed method prevents the work function layers from merging together and forming a thicker work function layer between adjacent nanosheets, thereby avoiding or reducing threshold voltage variation. Besides prevent movement of aluminum in the work function layers, the first liner material also improves the capacitance equivalent thickness, thereby advantageously reducing the capacitance of the device formed.

In an embodiment, a semiconductor device includes: a fin protruding above a substrate; source/drain regions over the fin; nanosheets between the source/drain regions; and a gate structure over the fin and between the source/drain regions, wherein the gate structure includes: a gate dielectric material around each of the nanosheets; a first liner material around the gate dielectric material; a work function material around the first liner material; a second liner material around the work function material; and a gate electrode material around at least portions of the second liner material. In an embodiment, the second liner material and the first liner material are a same material. In an embodiment, the nanosheets are parallel to each other and are parallel to a major upper surface of the substrate. In an embodiment, the semiconductor device further includes inner spacers between the nanosheets, wherein the inner spacers are disposed at opposite ends of the nano sheets. In an embodiment, the semiconductor device further includes an interfacial dielectric material between each of the nanosheets and the gate dielectric material. In an embodiment, the interfacial dielectric material, the gate dielectric material, the first liner material, the work function material, and the second liner material fill a space between adjacent ones of the nanosheets. In an embodiment, the interfacial dielectric material, the gate dielectric material, the first liner material, the work function material, and the second liner material further fill a space between the fin and a lowermost nanosheet of the nanosheets closest to the fin. In an embodiment, the nanosheets comprises a first nanosheet and a second nanosheet, and the second nanosheet is over and adjacent to the first nanosheet, wherein the gate electrode material extends between the first nanosheet and the second nanosheet. In an embodiment, the gate dielectric material, the first liner material, the work function material, and the second liner material have a first thickness over a topmost nanosheet of the nanosheets distal from the fin, and have a second thickness between adjacent ones of the nanosheets, wherein the first thickness is smaller than the second thickness. In an embodiment, the second liner material and the first liner material are titanium nitride. In an embodiment, the work function material is titanium aluminum carbide.

In an embodiment, a semiconductor device includes: a fin protruding above a substrate; a gate structure over the fin; source/drain regions over the fin on opposing sides of the gate structure; and a first channel layer and a second channel layer disposed between the source/drain regions, wherein the second channel layer is between the first channel layer and the fin, wherein the gate structure includes: a gate dielectric material around the first channel layer and around the second channel layer; a first liner material around the gate dielectric material; a work function material around the first liner material; a second liner material around the work function material, wherein the first liner material and the second liner material are a same material; and a gate electrode. In an embodiment, the semiconductor device further includes inner spacers between first end portions of the first channel layer and second end portions of the second channel layer, wherein the gate dielectric material, the first liner material, the work function material, and the second liner material fill a space between the inner spacers. In an embodiment, the first liner material and the second liner material are titanium nitride, and the work function material is titanium aluminum carbide. In an embodiment, the gate dielectric material, the first liner material, the work function material, and the second liner material have a first thickness over the first channel layer and have a second thickness between the first channel layer and the second channel layer, wherein the first thickness is smaller than the second thickness. In an embodiment, the second thickness is about twice the first thickness. In an embodiment, the gate dielectric material, the first liner material, the work function material, and the second liner material fill a space between the first channel layer and the second channel layer.

In an embodiment, a method of forming a semiconductor device includes: forming a fin protruding above a substrate; forming source/drain regions over the fin; forming nanosheets over the fin and between the source/drain regions, the nanosheets extending parallel to each other and comprising a first semiconductor material; forming a gate dielectric material around each of the nanosheets; forming a first liner material around the gate dielectric material; forming a work function material around the first liner material; forming a second liner material around the work function material, wherein the first liner material and the second liner material are formed of a same material; and forming a gate material around at least portions of the second liner material. In an embodiment, the nanosheets comprises a first nanosheet and a second nanosheet that is over and adjacent to the first nanosheet, wherein the second liner material around the first nanosheet merge with the second liner material around the second nanosheet, and a gap between the first nanosheet and the second nanosheet is free of the gate material. In an embodiment, the first liner material and the second liner material are silicon nitride, and the work function material is titanium aluminum carbide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin protruding above a substrate;
a gate structure over the fin;
source/drain regions over the fin on opposing sides of the gate structure; and
a first channel layer and a second channel layer disposed between the source/drain regions, wherein the second channel layer is between the first channel layer and the fin, wherein the gate structure comprises:
a gate dielectric material around the first channel layer and around the second channel layer;
a first liner material around and in contact with the gate dielectric material;
a work function material around and in contact with the first liner material;
a second liner material around and in contact with the work function material, wherein the first liner material and the second liner material are the same material; and
a gate electrode.

2. The semiconductor device of claim 1, wherein the work function material is titanium aluminum carbide, wherein the second liner material and the first liner material are titanium nitride.

3. The semiconductor device of claim 1, further comprising inner spacers between first end portions of the first channel layer and second end portions of the second channel layer.

4. The semiconductor device of claim 3, wherein the gate dielectric material, the first liner material, the work function material, and the second liner material fill a space between the inner spacers.

5. The semiconductor device of claim 1, further comprising an interfacial layer between the gate dielectric material and the first channel layer, and between the gate dielectric material and the second channel layer.

6. The semiconductor device of claim 5, wherein the interfacial layer, the gate dielectric material, the first liner material, the work function material, and the second liner material form a gate stack layer, wherein the gate stack layer has a first thickness between the first channel layer and the second channel layer, and has a second thickness over the first channel layer, wherein the second thickness is different from the first thickness.

7. The semiconductor device of claim 6, wherein the second thickness is about half the first thickness.

8. The semiconductor device of claim 6, wherein the first thickness is equal to a distance between the first channel layer and the second channel layer.

9. The semiconductor device of claim 1, wherein the gate structure, the source/drain regions, the first channel layer and the second channel layer are in an n-type device region of the semiconductor device.

10. A semiconductor device comprising:
a fin protruding above a substrate;
source/drain regions over the fin;
nanosheets between the source/drain regions;
a gate layer stack around the nanosheets, wherein the gate layer stack fills spaces between adjacent nanosheets, wherein the gate layer stack has a first number of sublayers at a first location between adjacent nanosheets, and has a second number of sublayers at a second location over a topmost nanosheet distal from the substrate, the first number being larger than the second number, wherein the gate layer stack has a first thickness at the first location and has a second thickness at the second location, the first thickness being about twice the second thickness; and
a gate electrode material around the gate layer stack.

11. The semiconductor device of claim 10, wherein the gate layer stack fills gaps between adjacent nanosheets such that the gaps between adjacent nanosheets are free of the gate electrode material.

12. The semiconductor device of claim 10, wherein the gate layer stack includes a sublayer of a gate dielectric material, a sublayer of a first liner material, a sublayer of a work function material, and a sublayer of a second liner material.

13. The semiconductor device of claim 12, wherein at the first location between adjacent nanosheets, the gate layer stack has two sublayers of the gate dielectric material, two sublayers of the first liner material, two sublayers of the work function material, and one sublayer of the second liner material, wherein at the second location over the topmost nanosheet, the gate layer stack has one sublayer of the gate dielectric material, one sublayer of the first liner material, one sublayer of the work function material, and one sublayer of the second liner material.

14. The semiconductor device of claim 12, wherein the nanosheets, the source/drain regions, and the gate layer stack are in an n-type device region of the semiconductor device.

15. The semiconductor device of claim 12, wherein the first liner material is the same as the second liner material, wherein the gate dielectric material surrounds the nanosheets, the first liner material contacts and surrounds the gate dielectric material, the work function material contacts and surrounds the first liner material, and the second liner material contacts and surrounds the work function material.

16. The semiconductor device of claim 11, further comprising inner spacers between end portions of the nanosheets, wherein the gate layer stack fills a space between the inner spacers.

17. The semiconductor device of claim 10, wherein the first thickness is equal to a distance between adjacent nanosheets.

18. A method of forming a semiconductor device, the method comprising:
forming, in an n-type device region, a fin protruding above a substrate;
forming n-type source/drain regions over the fin;
forming nanosheets over the fin and between the n-type source/drain regions, the nanosheets comprising a first semiconductor material;
forming a gate dielectric material around each of the nanosheets;

forming a first liner material around the gate dielectric material;

forming an n-type work function material around the first liner material;

forming a second liner material around the n-type work function material; and forming a gate material around at least portions of the second liner material.

19. The method of claim 18, wherein the first liner material and the second liner material are formed of the same material.

20. The method of claim 18, further comprising forming inner spacers between end portions of the nanosheets, wherein the gate dielectric material, the first liner material, the n-type work function material, and the second liner material are formed to fill a space between the inner spacers.

* * * * *